United States Patent
Watanabe

(10) Patent No.: US 10,937,763 B2
(45) Date of Patent: Mar. 2, 2021

(54) SEMICONDUCTOR LEADFRAMES AND PACKAGES WITH SOLDER DAMS AND RELATED METHODS

(71) Applicant: SEMICONDUCTOR COMPONENTS INDUSTRIES, LLC, Phoenix, AZ (US)

(72) Inventor: Masakazu Watanabe, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/218,835

(22) Filed: Dec. 13, 2018

(65) Prior Publication Data

US 2019/0115315 A1    Apr. 18, 2019

Related U.S. Application Data

(63) Continuation of application No. 14/983,863, filed on Dec. 30, 2015, now Pat. No. 10,186,498, which is a
(Continued)

(51) Int. Cl.
*H01L 25/065*     (2006.01)
*H01L 21/48*      (2006.01)
(Continued)

(52) U.S. Cl.
CPC ........ *H01L 25/065* (2013.01); *H01L 21/4842* (2013.01); *H01L 23/49503* (2013.01);
(Continued)

(58) Field of Classification Search
CPC . H01L 25/065; H01L 23/49; H01L 23/49503; H01L 23/49513;
(Continued)

(56) References Cited

U.S. PATENT DOCUMENTS 5,838,076 A   11/1998   Zarrabian et al.
8,896,268 B2  11/2014   Sakurai et al.
(Continued)

FOREIGN PATENT DOCUMENTS

CN   102064585 A   5/2011
CN   102288810 A   12/2011
(Continued)

*Primary Examiner* — Fazli Erdem
(74) *Attorney, Agent, or Firm* — Adam R. Stephenson, LTD.

(57) ABSTRACT

A semiconductor package includes a leadframe having a first island and second island each having an upper surface corresponding with an upper surface of the leadframe. One or more tie bars couple the first island with the second island. At least one tie bar has a protrusion extending from the upper surface of the leadframe and configured to substantially prevent a flow of a solder between the first and second islands. A first die couples with the leadframe at the first island and a second die couples with the leadframe at the second island. At least one of the tie bars has a recess at a lower surface of the leadframe. The leadframe includes a slit between the first and second island.

16 Claims, 19 Drawing Sheets

Related U.S. Application Data continuation-in-part of application No. 14/813,314, filed on Jul. 30, 2015, now Pat. No. 10,290,907, which is a continuation-in-part of application No. 14/811,973, filed on Jul. 29, 2015, now Pat. No. 10,205,197, which is a continuation-in-part of application No. 14/809,425, filed on Jul. 27, 2015, now Pat. No. 10,205,330.

(51) Int. Cl.
*H01L 23/49* (2006.01)
*H01L 23/495* (2006.01)
*H01L 23/31* (2006.01)

(52) U.S. Cl.
CPC .. *H01L 23/49513* (2013.01); *H01L 23/49524* (2013.01); *H01L 23/49548* (2013.01); *H01L 23/49562* (2013.01); *H01L 23/49575* (2013.01); *H01L 23/3142* (2013.01); *H01L 2224/48137* (2013.01); *H01L 2224/48247* (2013.01); *H01L 2224/48465* (2013.01); *H01L 2224/73221* (2013.01); *H01L 2224/73265* (2013.01); *H01L 2225/06527* (2013.01); *H01L 2225/06555* (2013.01); *H01L 2924/181* (2013.01)

(58) Field of Classification Search
CPC ......... H01L 23/49524; H01L 23/49548; H01L 23/49562; H01L 23/49575; H01L 21/48; H01L 21/4842
USPC ....................................................... 257/666
See application file for complete search history.

(56) References Cited

U.S. PATENT DOCUMENTS

| | | | |
|---|---|---|---|
| 2003/0099075 | A1 | 5/2003 | Pannwitz |
| 2010/0052124 | A1* | 3/2010 | Sasaki ................. H01L 21/4842 |
| | | | 257/676 |
| 2010/0052125 | A1* | 3/2010 | Sasaki ................. B23K 20/005 |
| | | | 257/676 |
| 2011/0309408 | A1 | 12/2011 | Watanabe |
| 2012/0261825 | A1 | 10/2012 | Koike |
| 2016/0172272 | A1* | 6/2016 | Wong ...................... H01L 24/83 |
| | | | 257/676 |

FOREIGN PATENT DOCUMENTS

| | | | |
|---|---|---|---|
| JP | 2001068614 | A | 3/2001 |
| JP | 2001110986 | A | 4/2001 |
| JP | 2001339869 | A | 12/2001 |
| JP | 2007-5569 | * | 6/2005 |
| JP | 2007266218 | A | 10/2007 |
| JP | 2008192959 | A | 8/2008 |
| JP | 2009131020 | A | 6/2009 |
| JP | 2009283507 | A | 12/2009 |
| WO | 2010098501 | A | 9/2010 |

\* cited by examiner

FIG. 15A

Power On

| Bit | Q | QN | EXOR |
|---|---|---|---|
| 0 | 0 | 1 | 1 |
| 1 | 0 | 1 | 1 |
| 2 | 0 | 1 | 1 |
| 3 | 0 | 1 | 1 |

FIG. 15B

FUSE Reading (DATA=1011)

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 15C

Noise

| Bit | Q | QN | EXOR |
|---|---|---|---|
| 0 | 1 | 0 | 1 |
| 1 | 0 | 1 | 1 |
| 2 | 0 | 0 | 0 |
| 3 | 1 | 0 | 1 |

FIG. 15D

FUSE Re-reading

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 16A

Power On

| Bit | Q | QN | EXOR |
|---|---|---|---|
| 0 | 0 | 1 | 1 |
| 1 | 0 | 1 | 1 |
| 2 | 0 | 1 | 1 |
| 3 | 0 | 1 | 1 |

FIG. 16B

FUSE Reading (DATA=1011)

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 16C

Noise

| Bit | Q | QN | EXOR |
|---|---|---|---|
| 0 | 1 | 0 | 1 |
| 1 | 0 | 1 | 1 |
| 2 | 0 | 1 | 1 |
| 3 | 1 | 0 | 1 |

FIG. 16D

FUSE Re-reading

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

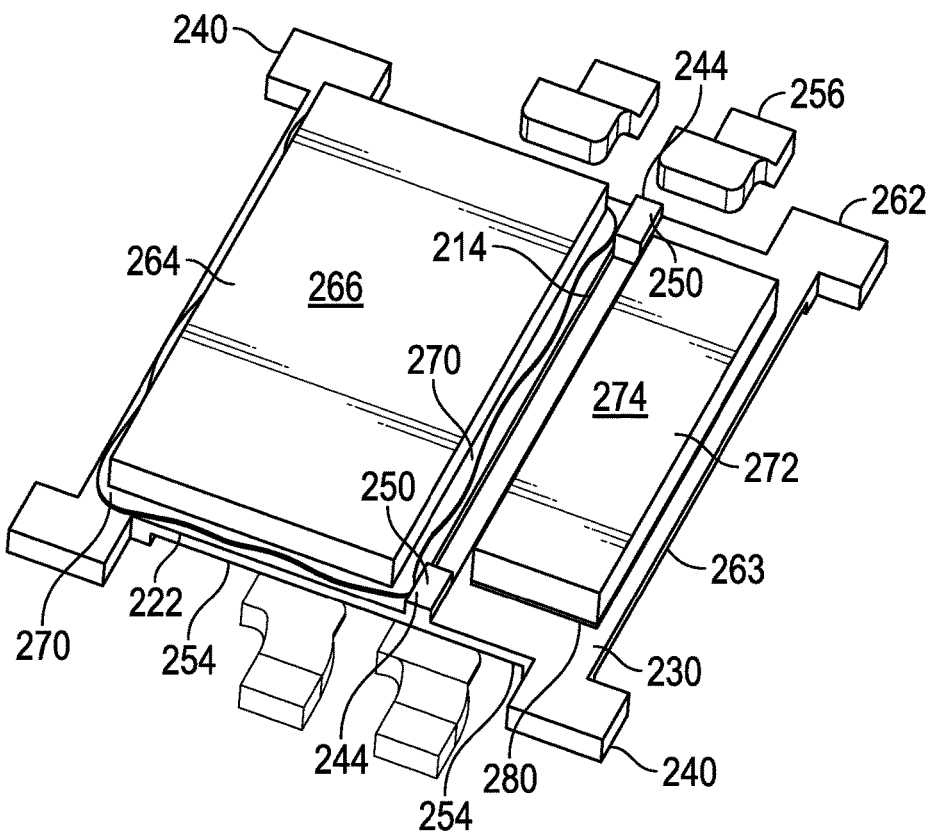
FIG. 21
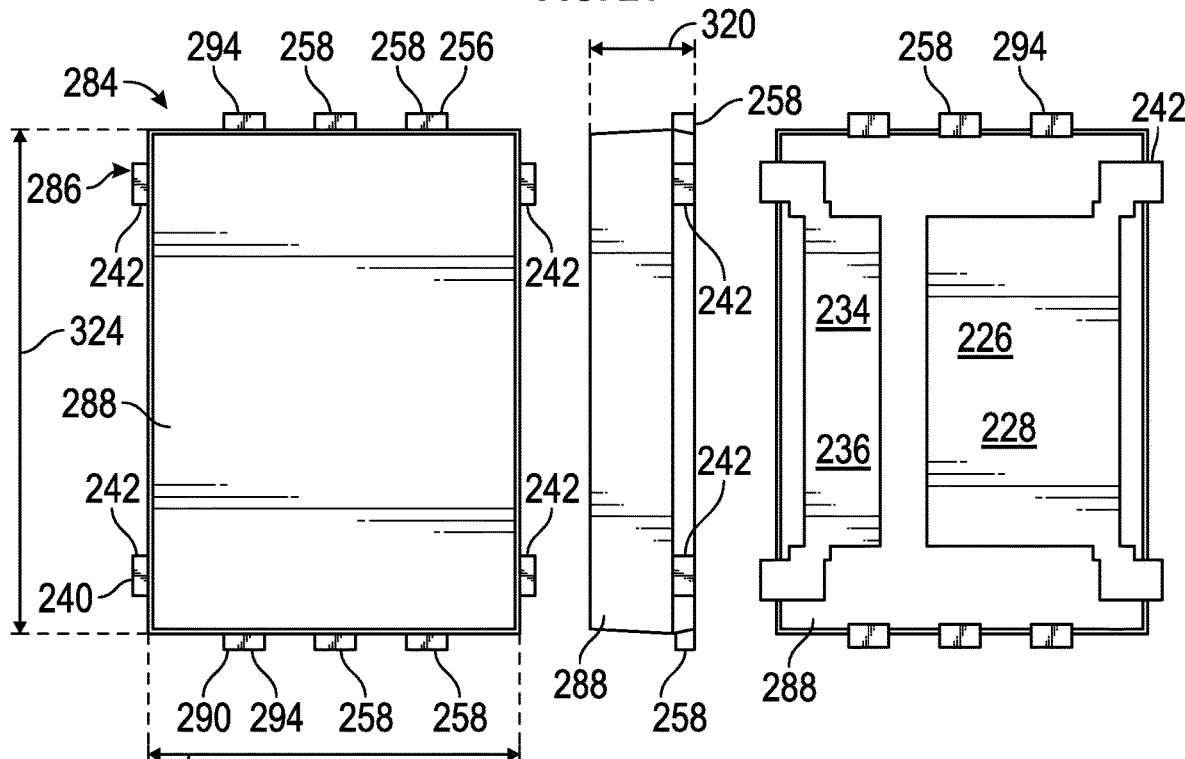
FIG. 22A     FIG. 22B     FIG. 22C

__(1)__

SEMICONDUCTOR LEADFRAMES AND PACKAGES WITH SOLDER DAMS AND RELATED METHODS

CROSS REFERENCE TO RELATED APPLICATIONS

This application is a continuation of the earlier U.S. Utility Patent Application to Watanabe entitled "Semiconductor Leadframes and Packages with Solder Dams and Related Methods," U.S. application Ser. No. 14/983,863, filed Dec. 30, 2015, which is a continuation-in-part of the earlier U.S. Utility Patent Application to Amemiya, et al. entitled "Automatically Programmable Battery Protection System and Related Methods," U.S. application Ser. No. 14/813,314, filed Jul. 30, 2015, which is a continuation-in-part of the earlier U.S. Utility Patent Application to Saito, et al. entitled "Automatically Programmable Battery Protection System and Related Methods," U.S. application Ser. No. 14/811,973, filed Jul. 29, 2015, which is a continuation-in-part application of U.S. Utility Patent Application to Saito, et al. entitled "Programmable Battery Protection System and Related Methods," U.S. application Ser. No. 14/809,425, filed Jul. 27, 2015, the disclosures of each of which are hereby incorporated entirely herein by reference.

BACKGROUND

1. Technical Field

Aspects of this document relate to semiconductor packages and leadframes for semiconductor packages.

2. Background Art

Semiconductor packages connect one or more semiconductor die to a motherboard or other associated circuitry and provide thermal and environmental protection for the die and other elements. Examples of various implementations of semiconductor packages include packages that include a leadframe to which the semiconductor die is/are coupled before being overmolded with a mold compound. Leads of the leadframe extend beyond the mold material, or may be exposed at and flush with an outer surface of the mold material in some leadless designs, and are used as electrical connections to the die inside the package.

Some semiconductor packages include one die that includes a switching element such as a metal-oxide-semiconductor field-effect transistor (MOSFET) or insulated gate bipolar transistor (IGBT) (transistor chip) and another die that includes a control element (control chip) in the same package. Various methods of including both a transistor chip and control chip in the same package while electrically isolating a lower surface of the control chip from a lower surface of the transistor chip include: forming electrically isolated islands and mounting each chip on a separate island, as described in U.S. Patent Application Publication No. 2011/03309408 titled "Semiconductor Device and Method of Producing Same," listing as first inventor Masakazu Watanabe, filed Aug. 25, 2011, published Dec. 22, 2011 (hereinafter the '408 Publication") (in the '408 Publication the leadframe includes no tie bars between the islands); placing both chips on the same island using insulated film (such as an insulating adhesive tape or an insulated liquid adhesive) at the lower surface of the control chip, as described in U.S. Pat. No. 6,756,689 titled "Power Device Having Multi-Chip Package Structure," listing as first inventor Shi-baek Nam, issued Jun. 29, 2004 (hereinafter "the '689 Patent"), and; mounting the control chip on top of the transistor chip using an insulated film (such as an insulated liquid adhesive) as also described in the '689 Patent; the disclosures of the '408 Publication and the '689 Patent are hereby incorporated entirely herein by reference.

SUMMARY

Implementations of a leadframe for a semiconductor package may include: a first island having an upper surface corresponding with an upper surface of the leadframe, the upper surface of the first island forming a largest planar surface of the leadframe; a second island having an upper surface corresponding with the upper surface of the leadframe, the upper surface of the second island forming a second largest planar surface of the leadframe, and; one or more tie bars coupling the first island with the second island; wherein at least one of the one or more tie bars has a protrusion extending upwards from the upper surface of the leadframe, the protrusion extending above a surface of one of the first island and the second island.

Implementations of a leadframe for a semiconductor package may include one, all, or any of the following:

The protrusion may substantially prevent a flow of a solder between the first island and the second island.

The first island and the second island may be coupled together only through the one or more tie bars.

The one or more tie bars may include two tie bars.

At least one of the one or more tie bars may include a recess at a lower surface of the leadframe.

The leadframe may include a slit between the first island and the second island.

One or more electrical contacts may extend from the first island and one or more electrical contacts may extend from the second island.

Implementations of a semiconductor package may include: a leadframe including: a first island having an upper surface corresponding with an upper surface of the leadframe; a second island having an upper surface corresponding with the upper surface of the leadframe, and; one or more tie bars coupling the first island with the second island, wherein at least one of the one or more tie bars has a protrusion extending from the upper surface of the leadframe, the protrusion configured to prevent a flow of a solder between the first island and the second island; a first die coupled with the leadframe at the first island; a second die coupled with the leadframe at the second island; a mold compound encapsulating the first die, the second die, at least a portion of the first island, and at least a portion of the second island, and; a plurality of electrical contacts each having an exposed surface exposed through the mold compound.

Implementations of semiconductor packages may include one, all, or any of the following:

At least one electrical connector may electrically couple the first die with at least one of the electrical contacts, at least one electrical connector may electrically couple the second die with at least one of the electrical contacts, and at least one electrical connector may electrically couple the first die with the second die.

At least one of the one or more tie bars may have a recess at a lower surface of the leadframe.

The leadframe may include a slit between the first island and the second island.

The leadframe may have only two tie bars between the first island and the second island, the two tie bars located on opposing ends of the slit.

The upper surface of the first island may form a largest planar surface of the leadframe.

The upper surface of the second island may form a second largest planar surface of the leadframe.

The mold compound may encapsulate a majority of the first island and a majority of the second island.

Implementations of semiconductor packages may include: a leadframe including: a first island having an upper surface corresponding with an upper surface of the leadframe, the upper surface of the first island forming a largest planar surface of the leadframe; a second island having an upper surface corresponding with the upper surface of the leadframe, the upper surface of the second island forming a second largest planar surface of the leadframe, and; one or more tie bars coupling the first island with the second island, wherein at least one of the one or more tie bars has a protrusion extending upwards from the upper surface of the leadframe, the protrusion extending above a surface of one of the first island and the second island; a first die coupled with the leadframe at the first island, the first die including a transistor including one of a field effect transistor (FET) and an insulated gate bipolar transistor (IGBT); a second die coupled with the leadframe at the second island, the second die including a control integrated circuit (control IC) configured to control the transistor; a mold compound encapsulating the first die, the second die, a majority of the first island, and a majority of the second island, and; a plurality of electrical contacts each having an exposed surface exposed through the mold compound.

Implementations of semiconductor packages may include one, all, or any of the following:

At least one electrical connector may electrically couple the first die with at least one of the electrical contacts, at least one electrical connector may electrically couple the second die with at least one of the electrical contacts, at least one electrical connector may electrically couple the first die with the second die, and a bottom surface of the second die may be coupled at the second island only through one or more electrical insulators.

The protrusion may be configured to substantially prevent a flow of a solder between the first island and the second island.

At least one of the one or more tie bars may have a recess at a lower surface of the leadframe.

The leadframe may include a slit between the first island and the second island, and the leadframe may have a first tie bar at a first end of the slit and a second tie bar at a second end of the slit.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 14-1 is a circuit diagram of a first portion of another implementation of circuitry included in a battery protection IC;

FIG. 14-2 is a circuit diagram of a second portion of another implementation of circuitry included in a battery protection IC;

FIG. 15A is a table showing the states of the first plurality of latches and states of the second plurality of latches at power on of the battery protection IC;

FIG. 15B is a table showing the states of the first plurality of latches and states of the second plurality of latches after data from the fuse array has been read into the corresponding latches of the first plurality of latches and second plurality of laches of the battery protection IC;

FIG. 15C is a table showing an altered latch resulting from noise and the corresponding resulting change in EXOR (XOR) gate state;

FIG. 15D is a table showing the states of the first plurality of latches and states of the second plurality of latches after data from the fuse array has been reread into the corresponding latches of the first plurality of latches and second plurality of laches of the battery protection IC in response to a logic trigger signal from a trigger circuit;

FIG. 16A is a table showing the states of the first plurality of latches and states of the second plurality of latches at power on of the battery protection IC;

FIG. 16B is a table showing the states of the first plurality of latches and states of the second plurality of latches after data from the fuse array has been read into the corresponding latches of the first plurality of latches and second plurality of laches of the battery protection IC;

FIG. 16C is a table showing two altered latches resulting from noise and the corresponding unchanged EXOR (XOR) gate state;

FIG. 16D is a table showing the states of the first plurality of latches and states of the second plurality of latches after data from the fuse array has been reread into the corresponding latches of the first plurality of latches and second plurality of laches of the battery protection IC in response to a logic trigger signal from a trigger circuit;

FIG. 21 is a top perspective view of the singulated leadframe of FIG. 17 with two semiconductor die coupled therewith;

FIG. 22A is a top view of an implementation of a semiconductor package including the elements of FIG. 21;

FIG. 22B is a side view of the semiconductor package of FIG. 22A;

FIG. 22C is a bottom view of the semiconductor package of FIG. 22A;

DESCRIPTION

This disclosure, its aspects and implementations, are not limited to the specific components, assembly procedures or method elements disclosed herein. Many additional components, assembly procedures and/or method elements known in the art consistent with the intended semiconductor leadframes and packages with solder dams and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor leadframes and packages with solder dams and related methods, and implementing components and methods, consistent with the intended operation and methods.

Figure 3:
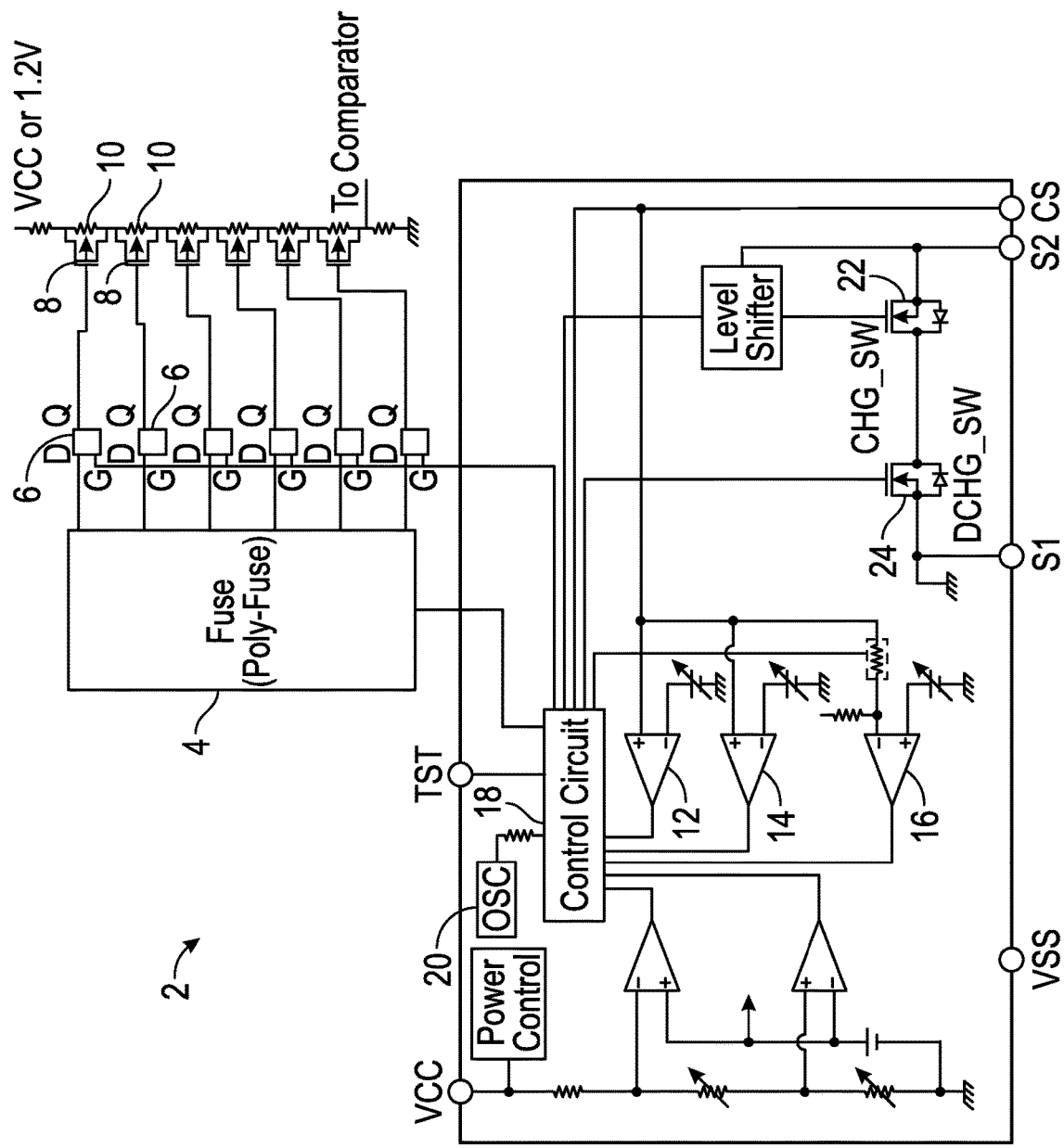
FIG. 3 is a circuit and block diagram view of a battery protection circuit included in a battery protection IC and included internal and external field effect transistors (FETs)

Referring to FIG. 3, an implementation of a battery control circuit 2 for use in a programmable battery protection system is illustrated. As illustrated, the battery control circuit 2 includes an array of fuses 4 coupled with a plurality of latches 6, and with a plurality of p-channel metal oxide semiconductor field effect transistors (MOSFETs) 8. The plurality of p-channel MOSFETs are each individually wired in parallel with a corresponding resistor 10 of a plurality of resistors that are coupled together in series. The output of the plurality of resistors is received by a comparator 12, 14, 16 and is the threshold (reference) voltage supplied to the comparator.

During operation, a voltage such as a bandgap voltage of about 1.2 V or the entire supply voltage from the battery is fed into the plurality of resistors 10. Based on whether the corresponding MOSFET 8 is open or closed, the current flows through the MOSFET 8. When current flows through the MOSFETs 8, this determines the ultimate summed resistance of the plurality of resistors 10 taking into account the rise and/or fall voltage characteristics of the MOSFETs 8. This summed resistance, in turn, according to Ohm's law, determines the final voltage output to the comparator 12, 14, 16, which is used by the comparator as a threshold (reference) voltage. Whether a particular p-channel MOSFET 8 is open or closed depends on whether a positive gate voltage is applied to the gate by a latch 6 of the plurality of latches. Whether each latch 6 has a stored voltage signal or the absence thereof is determined by whether the particular fuse 4 coupled to each latch is open or closed. In this way, as the latches 6, by design, are capable of maintain a voltage signal on the gates of the MOSFETs, the state (open/closed) of the fuses 4 need only be read once into the latches in various implementations. In various implementations, signals from an oscillator or clock 20 coupled to the battery control circuit 18 may be used to maintain the state of each of the plurality of latches 6 read from the fuse array 4.

Through the structure of the circuit illustrated in FIG. 3, the collective state of the array of fuses 4 can be used to encode a summed resistance value of the plurality of resistors 10, and, correspondingly, the threshold voltage applied to the comparator 12, 14, 16. Since each fuse 4 has only two states (open/closed) the array of fuses can be used to encode a binary value. In various implementations, this binary value stored in the fuse array 4 may initially be sent to the fuse array in serial form in the form of a trimming signal (fuse trimming signal), and additional circuitry may be employed to deserialize the data and assign it to the appropriate fuse for use in the trimming process. In so doing, the threshold voltage needed for the comparator may be effectively encoded in the array of fuses once the fuses have been trimmed by the trimming signal. The trimming signal is sent to the array of fuses from a battery control circuit 18 coupled to the fuse array 4.

A wide variety of circuit implementations and circuit component implementations are possible. In the implementation illustrated in FIG. 3, the plurality of latches are all gated D latches. In other implementations, however, other latch types could be employed, including, by non-limiting example, Earle latches, D flip-flops, JK flip-flops, gated SR latches, and any other latch type capable of holding a voltage on the gate of a MOSFET, including edge triggered latches. While p-channel MOSFETs are illustrated, n-channel or other MOSFET types could be used in various implementations. While the plurality of resistors are all illustrated as being arranged in series with the output of the comparator, in other implementations, one or more of the resistors could be arranged in parallel with the output to the comparator, creating a voltage divider circuit. The array of fuses can take several forms. In particular implementations, each fuse may be a polyfuse including of polysilicon. In various implementations, any of the fuse implementations disclosed in Japanese Patent Application Publication No. P2009-283507A to Yamaguchi et al. previously incorporated by reference, may be used in various implementations. Any number of two or more fuses in an array may be employed in various implementations. The array of fuses may form a programmable read only memory (PROM). In various implementations, the array of fuses may form a one-time programmable (OTP) memory.

The comparator 12, 14, 16 is part of or is a detector circuit that is used to detect an operating condition of a battery to which the battery protection system is coupled. In various implementations, the operating condition to be detected is an undesirable one, such as a battery discharge overcurrent condition, a battery charge overcurrent condition, or a battery short-circuit condition. Some of these conditions may damage the battery or create safety risks, particularly where the battery uses lithium ion technology. In various implementations, the voltage supplied to the comparator 12, 14, 16 is designed to allow the detector circuit to detect, one, all, or any of these conditions. In particular implementations, a separate detector circuit may be used to detect each of these conditions and send a detection signal to a battery control circuit that is capable of separating/breaking the connection between the battery and a load or charger (depending on the way the system is arranged) to prevent damage to the battery, load, charger, or all of these.

In various implementations, the same threshold voltage value may be supplied to all of the comparators 12, 14, 16 in the various detector circuits. In such implementations, only one array of fuses is needed, as the threshold voltage signal created by the latches, MOSFETs, and resistors can be provided for each comparator in each detector circuit. In other implementations, however, one or more of the detectors may require different threshold voltage from the others. In such implementations, more than one array of fuses may be employed. In other implementations, a single array of fuses may still be used but two or more sets of latches and two or more corresponding sets of resistors may be used to create two or more threshold voltages by reading out the states of different portions of the array of fuses into each set of latches.

The value of the threshold voltage may, in various implementations, be a strong function of one or more of the components in the battery protection integrated circuit 2. In the implementation illustrated in FIG. 3, the operating characteristics of the charging field effect transistor (FET) 22 and discharging FET 24, such as the on-resistance of either or both the charging FET and discharging FET, are the parameters that can be used to calculate the appropriate threshold voltage that corresponds with the existence of a discharge overcurrent, a charge overcurrent, or a short-circuit current being drawn from or input into the battery. In the system illustrated in FIG. 3, the charging and discharging FETs 22, 24 control the flow of current into and out of the battery itself, and so monitoring the inputs/output behavior of these devices permits the battery protection IC 2 to ensure that the undesirable condition does not exist. In particular implementations, both the charging and discharging FETs 22, 24 are activated during charging and discharging of the battery pack. In such implementations, an abnormal condition exists and would need to be detected by the detection circuits if only the charging FET 22 activated or if only the discharging FET 24 activated during charging or discharging. However, in other implementations, only the charging FET 22 may be activated during charging and the discharging FET 24 may be activated during discharging.

If the particular on resistances of the actual physical charging FET 22 and FET 24 in the battery protection IC 2 are known, then the threshold voltage(s) can be calculated given the particular over-discharge/over-discharge/short current specifications for the battery using various relationships, such as resistivity models or Ohm's law. Once these threshold voltage(s) have been calculated, the needed summed resistance to produce this voltage for of the plurality of resistors can be calculated with information regarding the available supply current and any relevant operating characteristics of the plurality of MOSFETs. For example, if the discharge overcurrent is 5 A, and the on resistance of both the discharge and charging FET is 10 milliohms, then, using Ohm's law, the discharge overcurrent threshold voltage would be 50 millivolts. Similarly, for the same discharge current of 5 A, on resistances of both the discharge and charging FET of 12 milliohms and 14 milliohms result in discharge overcurrent threshold voltages of 60 millivolts and 70 millivolts, respectively.

Using known values for the charge overcurrent, the discharge overcurrent, the shorting current, and the on-resistance of the charging FET/discharging FET or both the charging FET and discharging FET, the values of the charge overcurrent threshold voltage, the discharge overcurrent threshold voltage, and the short threshold voltage can be calculated. Additional comparators 16 and 14, respectively, receive these threshold voltages and feed a detection signal to the battery protection circuit 18. As previously discussed, if these threshold voltages differ from each other, then an additional fuse array and set of resistors may be employed (or multiple sets of latches/MOSFETs/resistors with a single fuse array).

Figure 4:
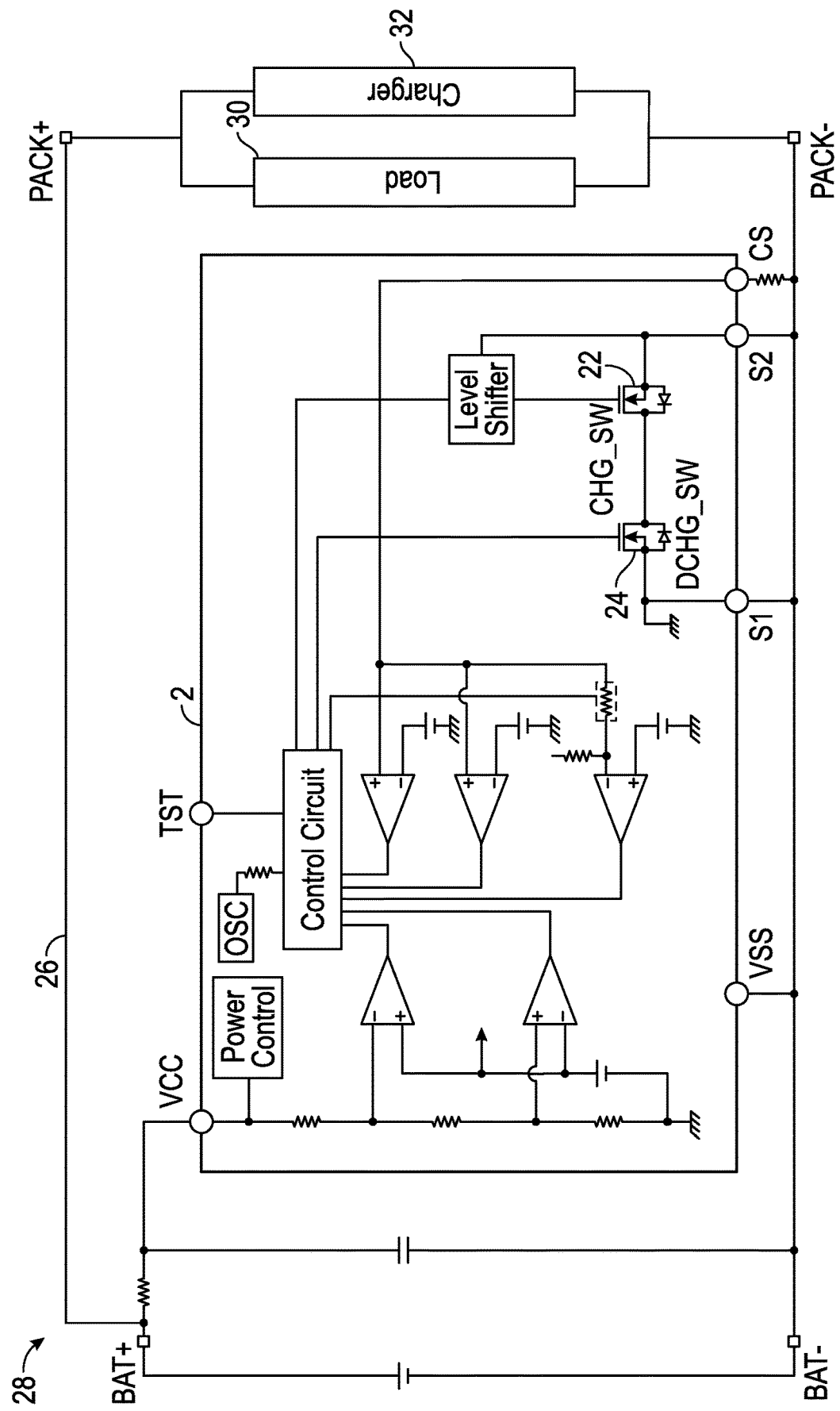
FIG. 4 is a circuit and block diagram of a battery and battery pack connected to a load and to a charger.

Referring to FIG. 4, during use, the battery protection IC 2 is incorporated into a battery pack 26 of a portable electronic device system 28. As illustrated, the system 28 can, at various times, include a load 30 and a charger 32. Depending on the characteristics of load 30, the charger 32 may be used concurrently with the load 30 or the load 30 and the charger 32 may be mutually exclusively used with the battery pack 26. The discharge FET 24 and the charging FET 22 are used to supply voltage and current to the load 30 and to receive voltage and current from the charger 32. Various battery pack systems have the discharge FET 24 and charging FET 22 mounted by themselves to a circuit board which contains contacts on a back side of the board that contact the battery cell(s) itself and contacts on a front side of the board that are designed to contact the load/charger. In particular implementations of battery protection ICs disclosed herein, the discharge FET 24 and the charging FET 22 may be included in the same semiconductor package and mounted at one location on the board of the battery pack 28.

Figure 1:
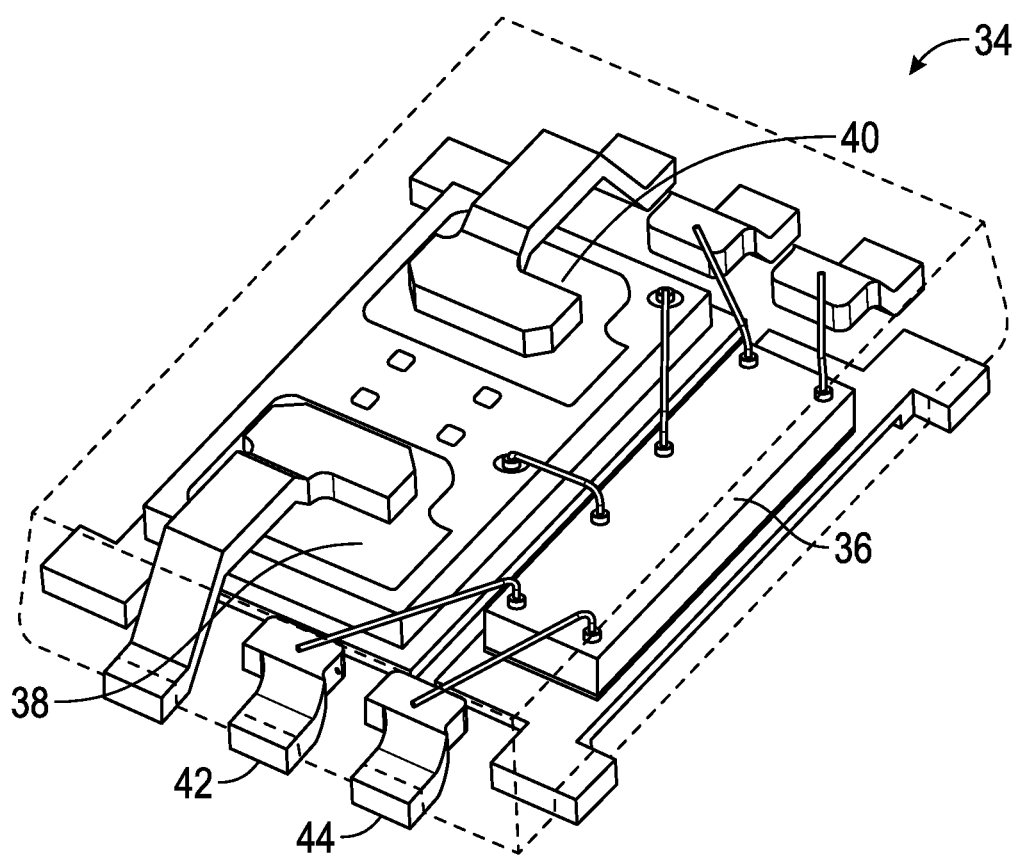
FIG. 1 is a see through view of a battery protection integrated circuit (IC)

Referring to FIG. 1, an implementation of a battery protection package 34 is illustrated. As illustrated, the mold compound of the package 34 is shown in see through so that the internal structure of the package 34 can be seen. As illustrated, a battery protection IC 36, the charging FET 40 and the discharge FET 38 are all included in the same package 34. While the battery protection IC 36 and the FETs 38, 40 have leadframes that are electrically isolated, the two chips are wire bonded together within the package 34 to allow the battery protection IC 36 to still control the operation of the FETs 38, 40. Various pins/leads may be included in the package 34 that electrically couple with the battery protection IC 36, including a current sense and testing pin 42 and a test (testing) pin 44. These pins interact with the board of the battery pack system. As can also be observed, the charging FET 40 and the discharge FET 38 are on the same chip, and were manufactured together on the same wafer. Accordingly, their on resistances may be very close in value to each other.

While FIG. 1 illustrates the battery protection IC 36 included in the same package as the charging and discharging FETs 40, 38, they could in various implementations be included in different packages as well.

In various implementations, the on resistance of the charging and discharging FETs used in battery packs is assumed to be exactly at the design specification. It has been discovered that the actual range of values on resistances of actual devices is in the range of 9.6 milliohms to 15.6 milliohms when a supply voltage of 3.7 V has been applied and the temperature of the devices is 25 C. This variation of about +/−25% of the midpoint of the range affects the ability of some detection circuitry to detect an overcurrent or short condition if the threshold voltages have been calculated using merely the design specification on resistance. This problem becomes particularly acute when the discharge current threshold voltage, charging current threshold voltage, and short current threshold voltage are a constant voltage value.

Figure 2:
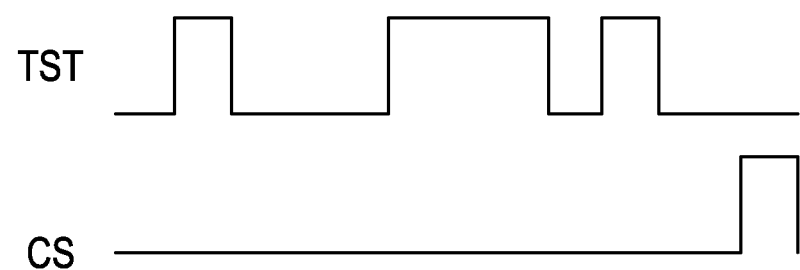
FIG. 2 is a diagram of a testing signal used to input trimming data to an array of fuses.

Implementations of battery protection ICs like those disclosed herein may utilize implementations of a method of providing a threshold (reference) voltage for a programmable battery protection system. Implementations of the method include, during application of a testing signal, measuring the on resistance of the charging FET and/or discharging FET and/or both the charging FET and discharging FET and calculating a threshold voltage using the on resistance using the battery protection circuit. The processing of calculating the threshold voltage may be any of those disclosed in this document and the threshold voltage may be any disclosed herein. With the calculated threshold voltage value, the battery protection circuit generates a fuse trimming signal and sends the fuse trimming signal to the array of fuses. Referring to FIG. 2, a graph of a testing signal (TST) and another testing signal (CS). As shown in FIG. 2, after measurement of the on resistance of a FET has been made, the testing signal (TST, CS) is used to convey the trimming signal to the fuse array. The fuse trimming signal is then used to open and leave closed those fuses corresponding with the received data in the trimming signal. These open and closed fused then change the comparator(s) threshold voltage(s) as described herein. The CS signal is used as an enable signal for the testing signal. The TST signal contains the serialized data used to trim the fuses. The CS pin is also used in various implementations for current sense signal detection while, in implementations, the TST pin has no further use during operation of the package after fuse trimming is completed.

The latches, using the clocking signal provided by the oscillator in various implementations, then read a state (open/closed) from each fuse and either change their state or remain closed as a result. A voltage is then applied to the gates of the plurality of MOSFETs that is a function of the states of the latches. The final summed resistance of the plurality of resistors is then established through the opening/closing of the various MOSFETs. The summed resistance is then used to supply the generated threshold voltage to a comparator included in a detector (detector circuit) and used as described herein. In the event the detector detects a deviation from the threshold voltage, a detection signal is sent to the battery protection circuit which takes action by separating a connection between the battery and the load and/or charger as needed to protect the battery.

Various method implementations permit the threshold voltage to be calculated at the time the battery pack is assembled and being prepared for shipping through measuring the actual on resistance of the charging and discharging FETs during a testing process. Since this is done after final assembly, the most accurate threshold voltage for each FET may be calculated. This threshold voltage generated during testing is based on the as-packaged and as-finally built values and will allow the battery protection IC to most accurately detect when a problem situation exists.

As disclosed herein, the method of programming or trimming the array of fuses takes place only once during the testing of the battery pack. Because the fuse array is a single write array (the fuses physically cannot be reclosed after being opened), it is not possible to reprogram or retrim the array of fuses after they have received the trimming signal.

Results of a comparison of methods and systems for using the on resistance of the FET to control the battery pack performance and the systems and methods disclosed herein may be found in Table 1 below:

TABLE 1

| Parameter | Condition | Disclosed System | Other System |
|---|---|---|---|
| Total Impedance | — | 11 milliohms | 10.1 milliohms |
| Overcurrent Comparator Reference | — | Variable Voltage Capable | Constant Voltage Only |
| Current Monitoring | Discharge Overcurrent = 6.9 A | 6.2 A to 7.6 A ($\Delta$ = 1.4 A). | 5.1 A to 10.7 A ($\Delta$ = 5.6 A) |
| Discharge Current | Max Allowed | 7.6 A | 10.7 A |
| Discharge Current | Min Allowed | 6.2 A | 5.1 A |

By inspection it is clear that implementations of programmable battery protection systems like those disclosed herein can provide several times better detection and performance may keep the battery pack operating much closer to design current specifications. This may reduce damage short term and long term to the battery pack and may better ensure safe operation of the pack. The heat generated by operation at 10.7 A, for example, over the long term may damage and/or potentially create a hazardous condition with the battery pack if the battery protection system is unable to detect the condition.

Figure 5:
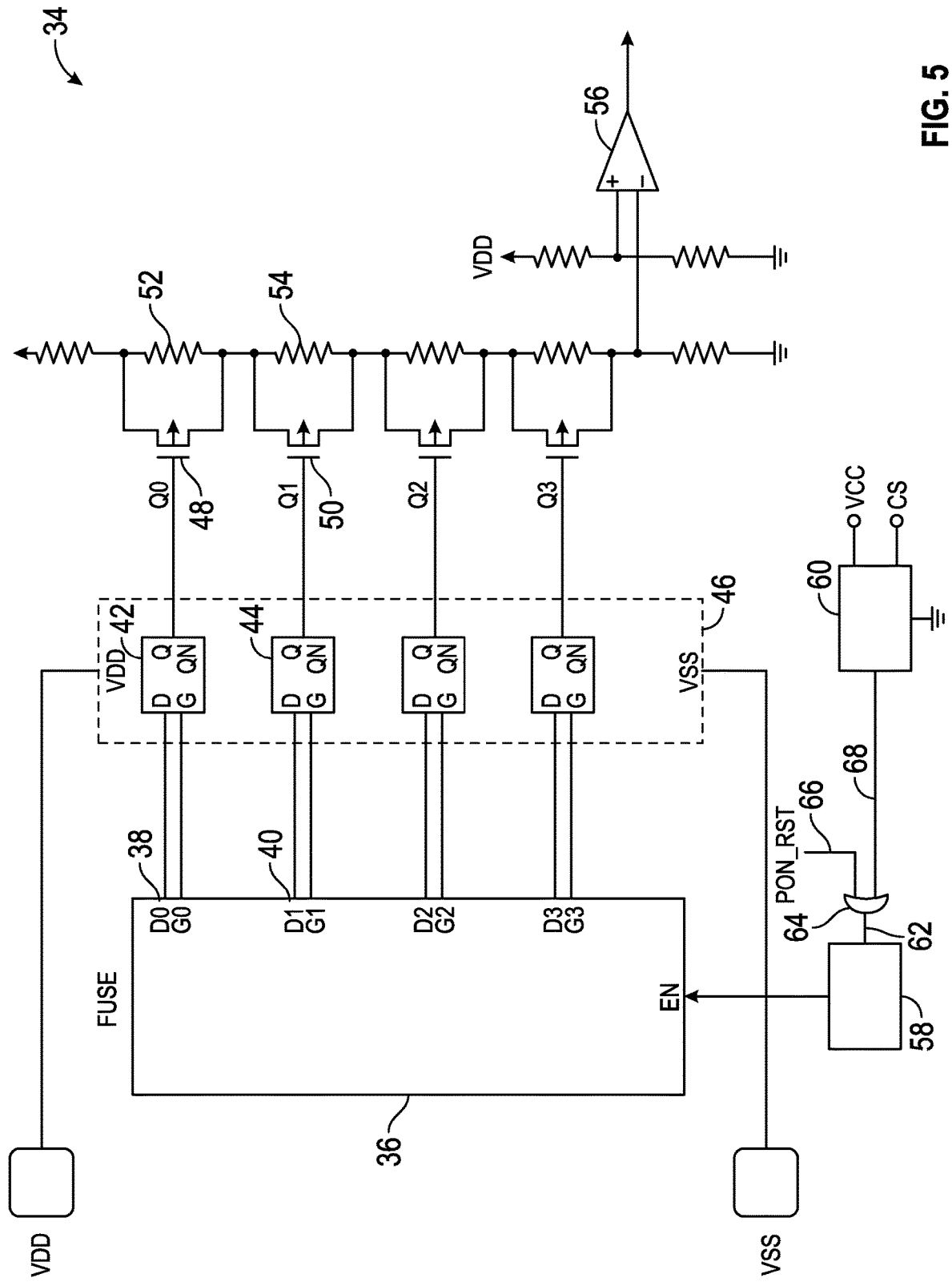
FIG. 5 is a circuit and block diagram of a fuse array, a fuse refresh circuit, and a trigger circuit.

Referring to FIG. 5, an implementation of circuitry 34 for an automatically refreshable programmable battery protection system is illustrated. As illustrated, the circuitry 34 includes a fuse array 36 where each fuse 38, 40 in the array 36 is coupled with a corresponding latch 42, 44 of a plurality of latches 46. Because of the structure of the latches 46, the state of each fuse 38, 40 is used to set a state of each corresponding latch 42, 44. In various implementations, the array of fuses 36 may be any type of fuse disclosed in this document and the latches may be any type of latch disclosed herein. As illustrated, the plurality of latches 46 are coupled with a plurality of MOSFETs 48, 50 which are coupled in parallel with a plurality of resistors 52, 54. The plurality of MOSFETs 48, 50 and resistors 52, 54 operate similarly as described herein to create a summed resistance which is used to generate a threshold voltage which is sent to a comparator 56 for use in detecting discharge overcurrent values, charge overcurrent values, and short current values as described herein.

The fuse array 36 is coupled with a fuse refresh circuit 58 which is coupled with a trigger circuit 60. A trigger signal 62 is formed by using an OR logic gate 64 to join a power on/reset signal 66 from a battery with an operating trigger signal 68 from the trigger circuit 60. As illustrated, the trigger circuit 60 is connected to a supply voltage (Vcc) and current sense (CS) signals to aid it in generating the operating trigger signal 68 as will be described in more detail herein.

Figure 10:
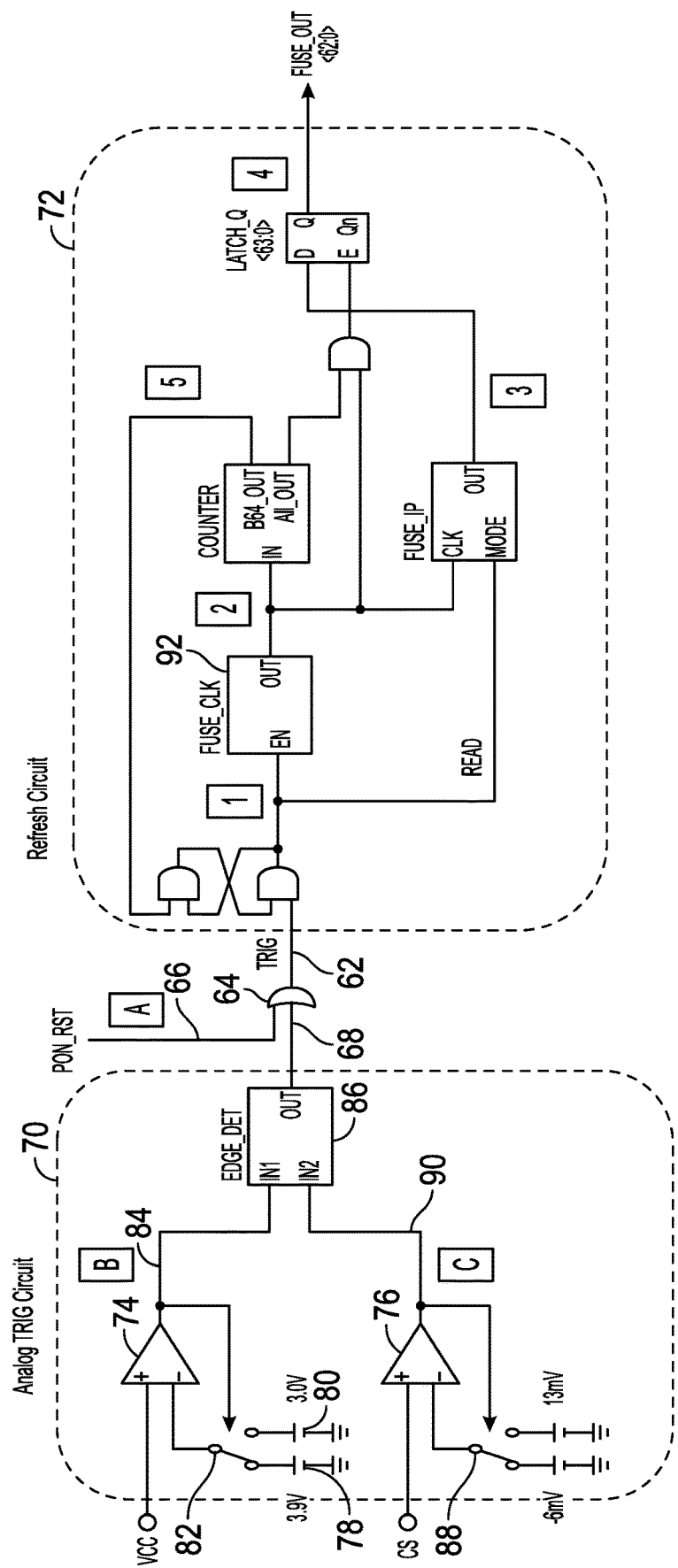
FIG. 10 is a circuit diagram of an implementation of a trigger circuit and an implementation of a refresh circuit including a latch.

Referring to FIG. 10, an implementation of a trigger circuit 70 and fuse refresh circuit 72 are illustrated. As illustrated, the trigger circuit 70 includes two comparators, a supply voltage comparator 74 and a current sense comparator 76. As illustrated, two reference voltages, one used for over charge voltage fuse refresh 78 and one used for over discharge voltage fuse refresh 80 are supplied to the supply voltage comparator 74 through switch 82. Whether the overcharge voltage fuse refresh reference voltage 78 or over discharge voltage fuse refresh reference voltage 80 is supplied to the comparator 74 is determined by the position of the switch 82. The switch 82 uses the supply voltage trigger signal 84 from the comparator 74 to determine its position. As illustrated, in the implementation of FIG. 10, the overcharge voltage fuse refresh reference voltage is 3.9 V and the over discharge voltage fuse refresh reference voltage is 3.0 V. When the supply voltage value is greater than 3.9 V during a charging cycle, the supply voltage trigger signal 84 from the comparator 74 swings to a logical 1 (or 0 in particular implementations). When this occurs, the switch 82 changes position to apply the discharge voltage fuse refresh reference voltage to the comparator 74. The change from logical 1 to logical 0 in the supply voltage trigger signal 84 is detected by edge detector 86 which then outputs the operating trigger signal 68 when the change is detected.

The current sense comparator 76 operates in similar fashion, as it includes a switch 88 which changes position in response to the swing of the current sense trigger signal 90 from logical 1 to logical 0, and vice versa. This will happen when a system overcharge current condition or system over discharge current condition are detected (and vice versa, depending on how the comparator is set up). The edge detector 86 likewise detects the swing of the current sense trigger signal 90 from logical 1 to logical 0 (and vice versa) and outputs the operating trigger signal 68 in response to detection of the shift.

OR logic gate 64 receives the operating trigger signal 68 and the power on/reset signal 66 from the battery and outputs trigger signal 62 (TRIG) to the fuse refresh circuit 72. Since the OR logic gate 64 is an OR gate, it outputs the trigger signal 62 whether either the operating trigger signal 68 or the power on/reset signal 66 is received. The structure of the fuse refresh circuit 72, in response to receiving the trigger signal 62, uses a fuse clock 92 to read each state of the plurality of fuses in the fuse array to each corresponding latch, thereby refreshing the states of the plurality of latches using the states of the plurality of fuses. As illustrated in FIG. 10, the fuse array is a 64 bit array, so 64 fuses are included, 1 per bit, which can then be coupled to up to 64 corresponding latches. More fuses or fewer fuses may be included in various implementations, depending on the number of bits of data desired to establish the needed summed resistance for threshold voltage generation.

Figure 7:
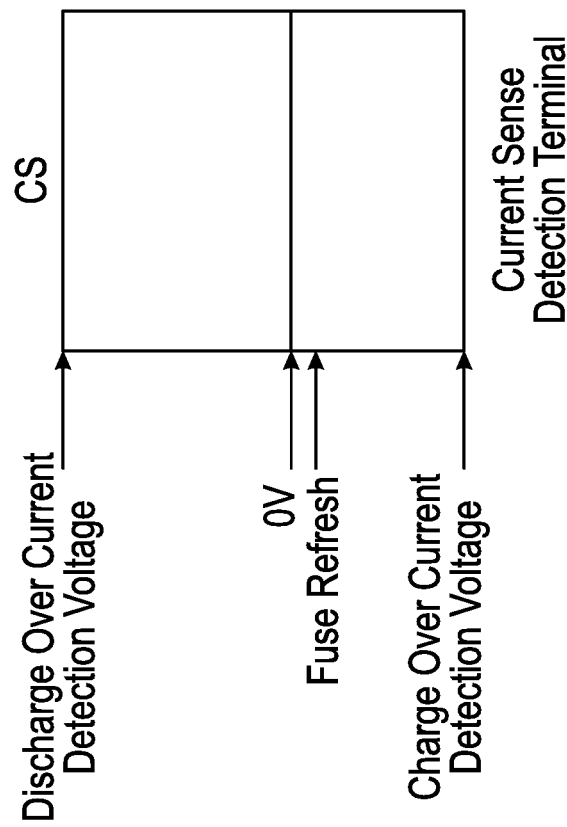
FIG. 7 is a diagram of a current sense value detected at a current sense detection terminal showing a discharge over current detection voltage, a charge over current detection voltage, and a fuse refresh level between these two points.
Figure 6:
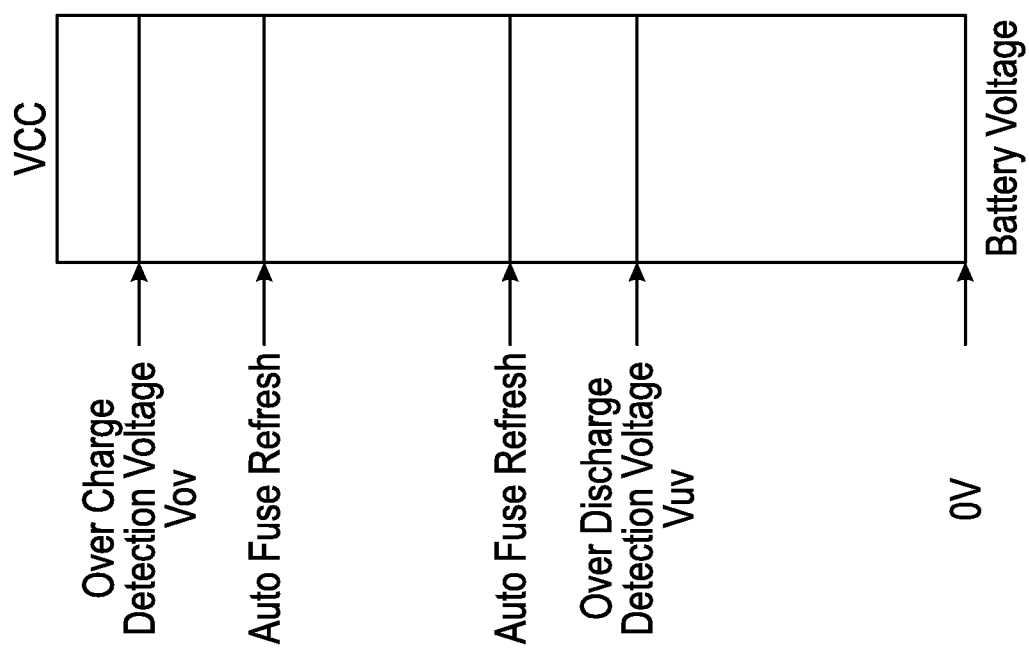
FIG. 6 is a diagram of a supply voltage showing the over charge detection voltage, over discharge detection voltage, and auto fuse refresh voltage levels between these two voltages.

Referring to FIGS. 6 and 7, FIG. 6 is a diagram of a supply voltage showing the overcharge detection voltage, over discharge detection voltage, and auto fuse refresh voltage levels between these two voltages. FIG. 7 is a diagram of a current sense value detected at a current sense detection terminal showing a discharge over current detection voltage, a charge over current detection voltage, and a fuse refresh level between these two points. These diagrams demonstrate that for the supply voltage Vcc, two different voltage levels labeled Auto Fuse Refresh are selected (predetermined) which are located below the overcharge detection voltage and above the over discharge detection voltage for the purpose of refreshing the latches from the fuses before either of the detection voltages are reached. These voltage levels correspond with the overcharge voltage fuse refresh 78 or over discharge voltage fuse refresh reference voltage 80 previously discussed.

Figure 8:
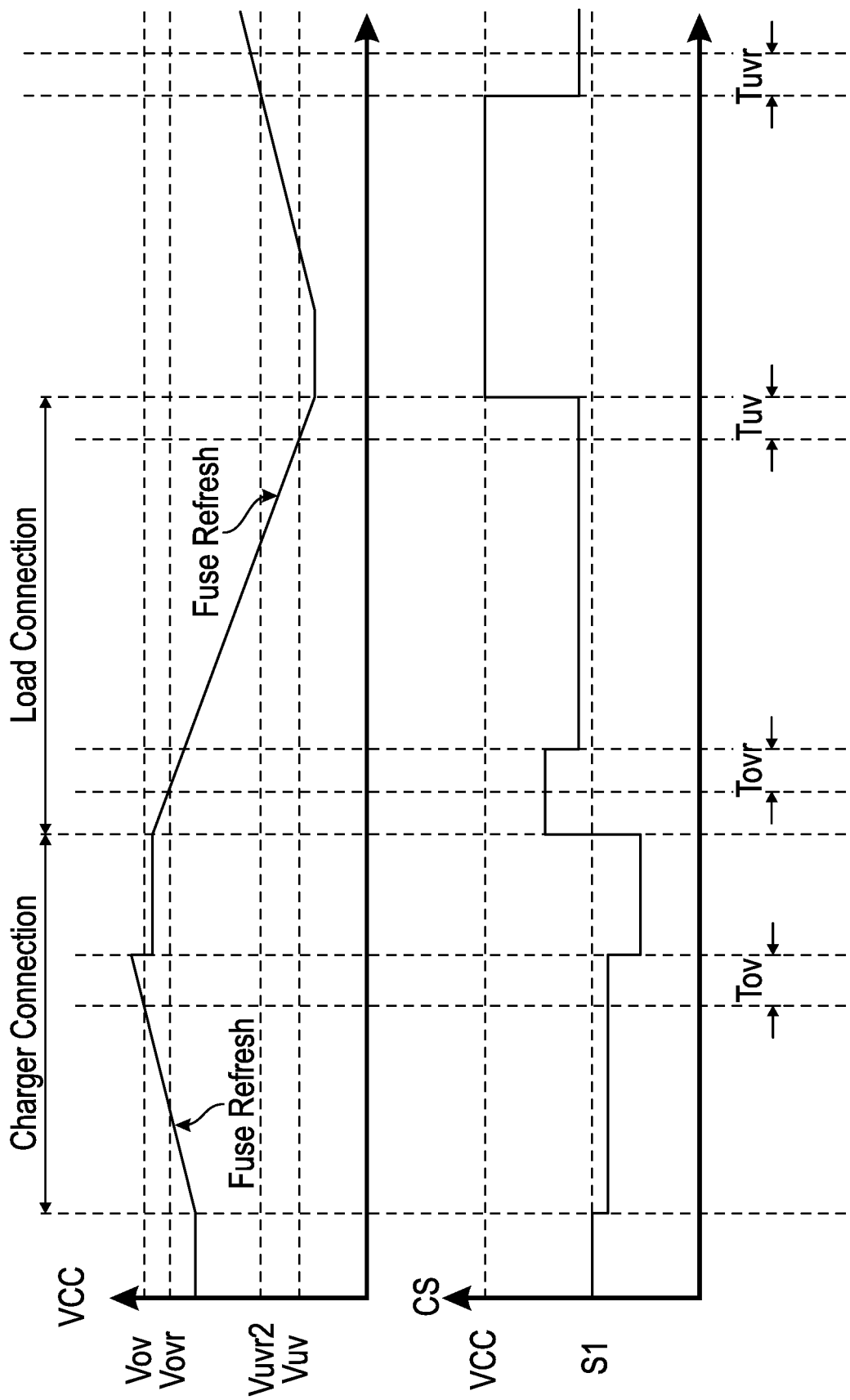
FIG. 8 is a graph of supply voltage (Vcc) and current sense (CS) over time showing the automatic fuse refresh points in response to a supply voltage trigger signal generated by the trigger circuit.

The purpose of selecting the voltage levels both below and above these levels can be observed in FIG. 8, which shows a graph of supply voltage over time and a corresponding graph of current sense signal over time. As illustrated, at the time when the charger is connected with the battery, the supply voltage level begins to rise toward its target maximum (the overcharge detection voltage). The auto fuse refresh voltage may be selected so that it is reached during the rise of the supply voltage during charging at a point in time to provide sufficient time for the fuse refreshing of the latches to be completed so as to ensure the desired threshold voltage is supplied to the detector circuits providing input to the battery control circuit included in the battery protection IC. As can be seen, after the fuses are refreshed, the detector circuits (using the comparators and the threshold voltage supplied), detect the existence of an overcharge voltage condition (Vov) and then the battery control circuit disconnects the battery from the charger, stopping the charging process, and retaining the battery at its fully charged supply voltage condition.

A similar process occurs when a load is applied to the battery. As can be seen from FIG. 8, the available supply voltage from the battery decreases over time until the auto fuse refresh voltage is reached, which results in a trigger signal being sent to the fuse refresh circuit, when then refreshes the latches with the fuse data. The auto fuse refresh voltage value may be similarly set so that the fuse refresh process can be accomplished in sufficient time before the load discharges the battery to reach the over discharge voltage detection voltage level (Vuv). The foregoing assumes that the load will continue draw power from the battery at the same consumption rate at the time the auto fuse refresh voltage level was reached. While this may not occur in all situations, it represents an implementation of a safety practice, that as the battery approaches the overcharge or over discharge voltage levels, the fuse data is refreshed into the latches.

The importance of being able to refresh the states of the plurality of latches (and thereby the threshold voltage(s) of the detector circuits) is that it may permit the battery protection IC to ensure the battery operates within safe operating ranges. This is even if the states of one or more of the plurality of latches are altered by noise or other interference that changes the state of one or more of the plurality of latches. For example, if the latch was designed to hold a 1, but through noise interference, the value became a 0, the resulting summed resistance (via the corresponding MOSFET and resistor) would result in an incorrect threshold voltage. Also, if the latch was placed in a metastable state in which it was able to properly store/communicate/settle to either a 1 or 0 state as a result of the noise, the effect on the summed resistance and threshold voltage would be similar. Being able to automatically refresh the plurality of latches with fuse data at points during operation of the battery where the threshold voltage values are important to have accurately communicated may mitigate any noise risks involved in using latches to store the fuse states. It may also reduce power consumption caused by the reading of the fuse values more often than needed to ensure the proper latch values are in place at particular operating battery conditions.

The risks associated with operating with incorrect latch values (and correspondingly, incorrect threshold values) are not insignificant. If the threshold voltage value is incorrect and allows the battery to overcharge, it may explode. If the threshold voltage value is incorrect and allows the battery to over discharge, a hazardous condition may be created in the battery cell as copper from the contacts and other structure of the cell may be drawn into the lithium ion portion of the cell, which could cause a fire (for lithium ion battery types). Use of the automatic refreshing capabilities of the latches may accordingly mitigate risks associated with using latches relating to interference from noise and external forces that could negatively impact safety and other performance.

Figure 9:
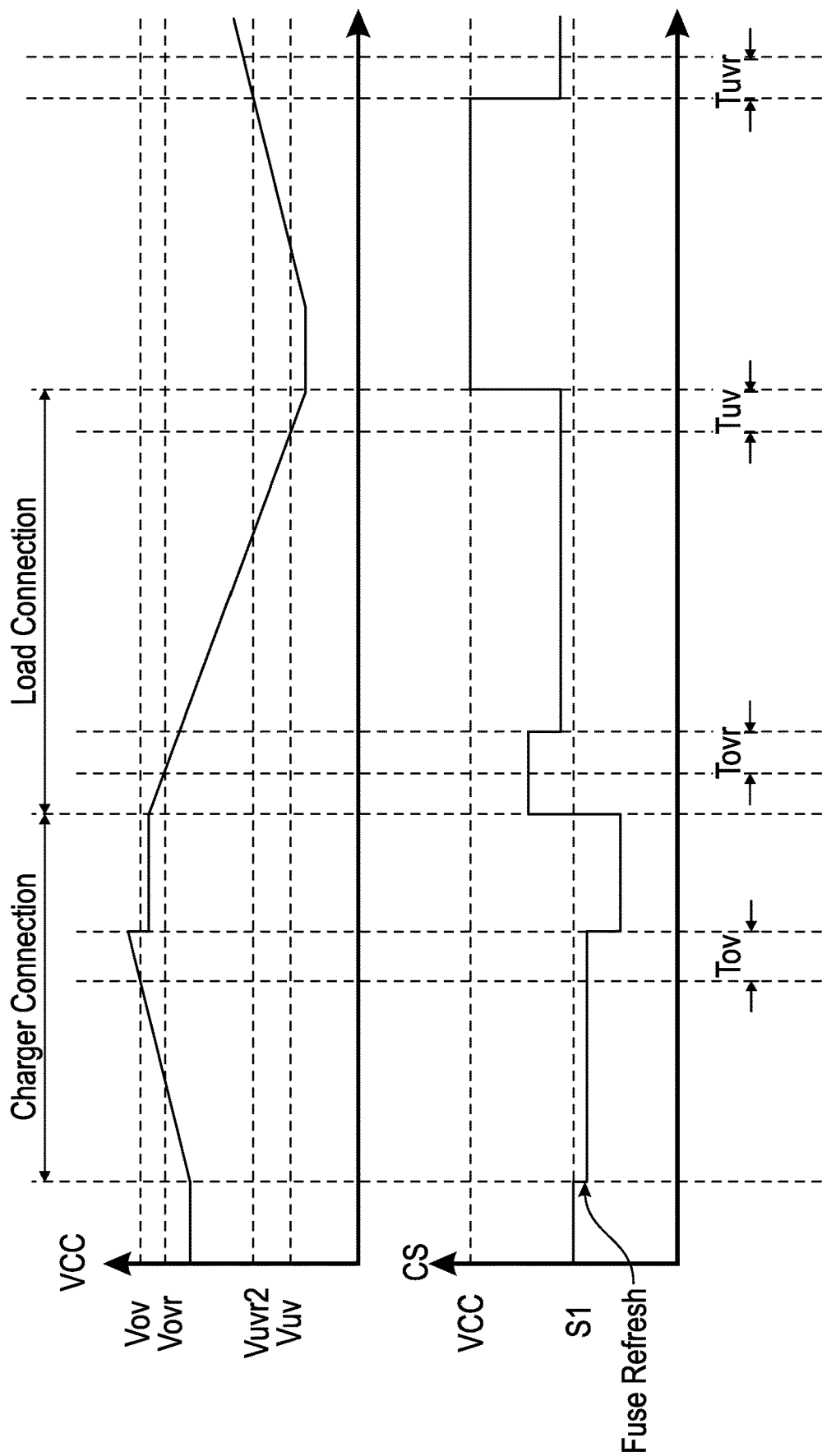
FIG. 9 is a graph of supply voltage (Vcc) and current sense (CS) over time showing the automatic fuse refresh points in response to a current sense trigger signal generated by the trigger circuit.

Referring to FIGS. 7 and 9, the fuse refreshing behavior of the system based on the current sense signal is illustrated. As illustrated in FIG. 7, a fuse refresh voltage level below 0 V is established that is above a charge over detection voltage based on the current sense signal. In various implementations, another fuse refresh voltage level above 0 V may be established to handle situations where the discharge over current detection voltage is being approached. This fuse refresh voltage level is represented in FIG. 10 as the bottom level (−6 mV) of the switch 88 that inputs to the comparator 76 for the current sense signal. Because both the supply voltage trigger signal 84 and the current sense trigger signal 90 are detected by the edge detector 86, changes in either of them will trigger generation of the operating trigger signal 68. Accordingly, both changes in supply voltage and the current sense signal can result in fuse refreshing of the plurality of latches. FIG. 9 illustrates how, at the time the battery is first connected to the charger, an immediate reversal of the current flow to the battery results which is sensed as a negative current sense voltage signal. Since this negative voltage is less than the fuse refresh voltage value illustrated in FIG. 7, it triggers a refreshing of the states of the plurality of latches from the array of fuses to ensure that the proper threshold voltage values are present at the beginning of the charging cycle. In this way, the current sense and supply voltage are used complimentarily to provide proactive updating of the stored values in the plurality of latches at predefined operating points of the battery.

Figure 11:
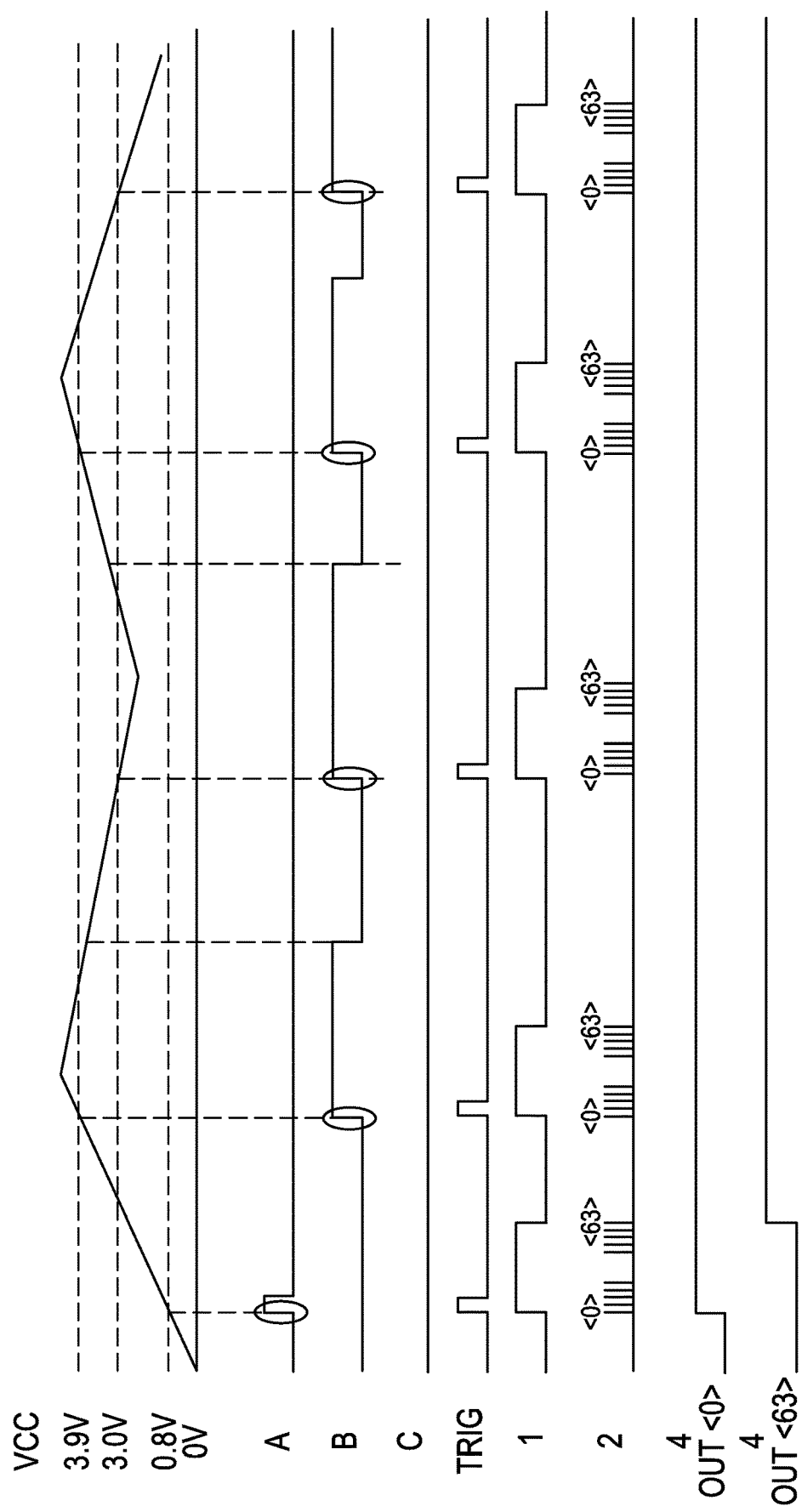
FIG. 11 is a supply voltage and trigger signal diagram for the circuit implementation of FIG. 10 when a supply voltage trigger signal is used.
Figure 12:
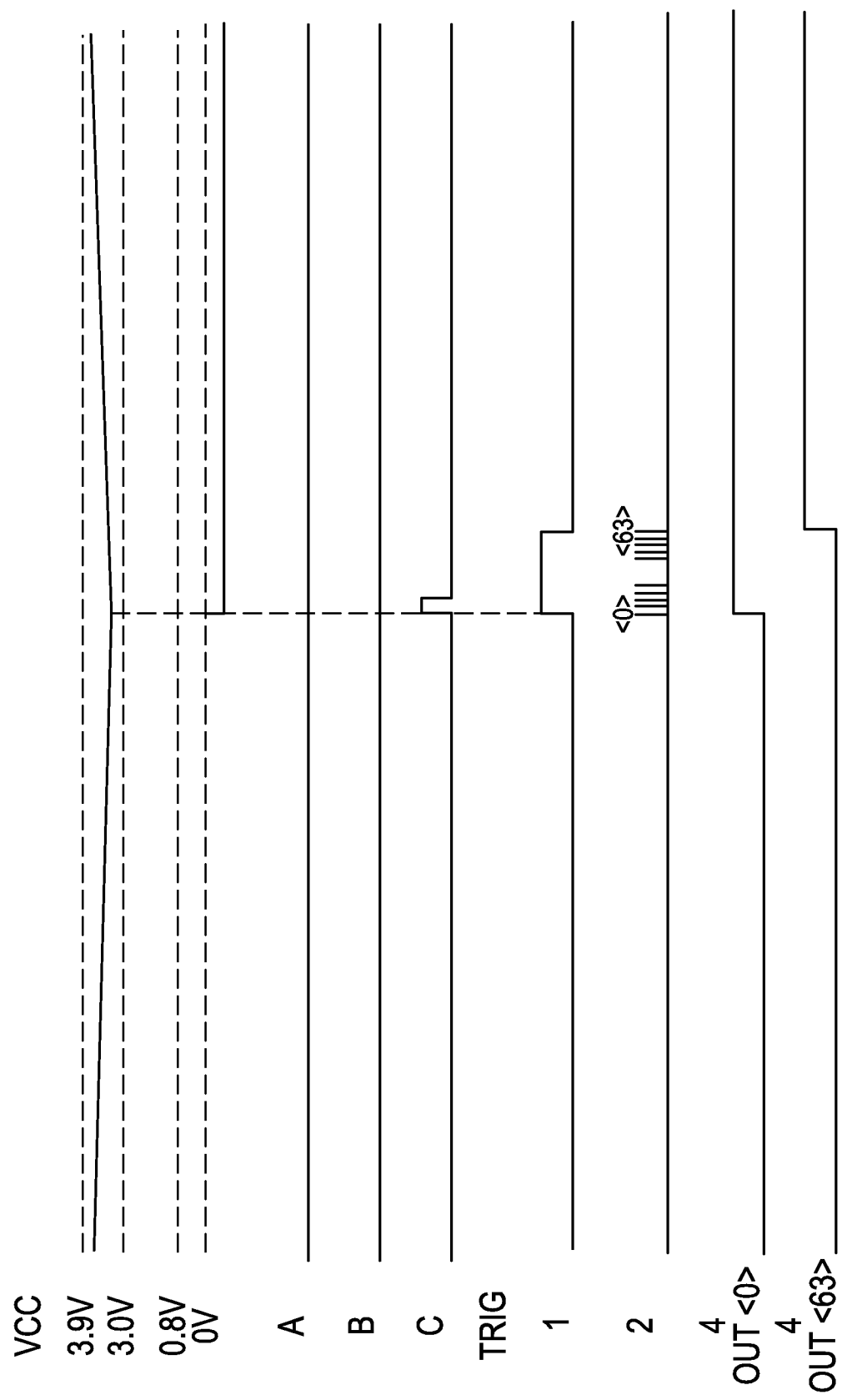
FIG. 12 is a supply voltage and trigger signal diagram for the circuit implementation of FIG. 10 when a current sense trigger signal is used.

FIGS. 11 and 12 illustrate the flow of signals through the circuit implementation illustrated in FIG. 10 during a charging and discharging cycle and during a current sense fluctuation cycle. The letters and numbers on the left of the graph correspond to locations on the circuit and show the signals passing through the components at that location during the cycle. For example, for FIG. 11, signal A is the power on/reset signal 66 which is received just as the charger is coupled with the battery. As can be seen, this results in a trigger signal 62 (TRIG) being sent to the fuse refresh circuit which is detected at location 1 and results in activating of the counter represented at location 2 which reads out all of the fuse values in the fuse array (64 of them in this case) at location 4 which are then then sent to the corresponding latches of the plurality of latches to refresh their states. Similarly, the same process is repeated during charging when the auto fuse refreshing value of 3.9 V is reached—in this case, the comparator 74 generates supply voltage trigger signal 84 which results in generation of trigger signal 62 which causes fuse refreshing circuit to refresh the values of the plurality of latches. FIG. 12 is a similar graph showing that at the inflection point of the current sense signal, the comparator 76 generates the current sense trigger signal 90 which generates trigger signal 62, detected at location 1 and which starts the process in location 2 to read out the states of each fuse of the array of fuses to location 4 where they are output to the corresponding latches of the plurality of latches.

While the use of an OR gate has been described to generate a trigger signal from either an operating trigger signal or a power on/reset trigger signal, in various implementations, the OR gate may not be used, and the trigger signal could be either the operating trigger signal or the power on/reset trigger signal by itself. Also, while implementations disclosed herein monitor both supply voltage and the current sense signal, other implementations may monitor only supply voltage or current sense signal for use in automatic fuse refreshing.

Various implementations of automatic fuse refreshing systems for use with automatically refreshable programmable battery protection systems may include structures and methods for detecting and correcting errors caused by noise and/or interference with the plurality of latches. In such systems, electrical noise or other interference alters the state of one or more of the plurality of latches, which, if left uncorrected, will change the threshold voltage being used by the battery control circuit to evaluate the performance of the battery. This could potentially place the battery in an unsafe state, one which could not be detected by the battery protection IC due to the influence of the noise changing the threshold voltage itself. Since the data values being actively used for creating the threshold voltage are stored in the latches, which are a form of rewritable, volatile memory, the ability to detect any changes in the stored values and refresh the values from the fuse array may be valuable to maintain system performance and safety over the lifecycle of the battery, rather than relying on a single writing of data to the latch or a power-consuming regularly scheduled fuse refreshing process.

Figure 13:
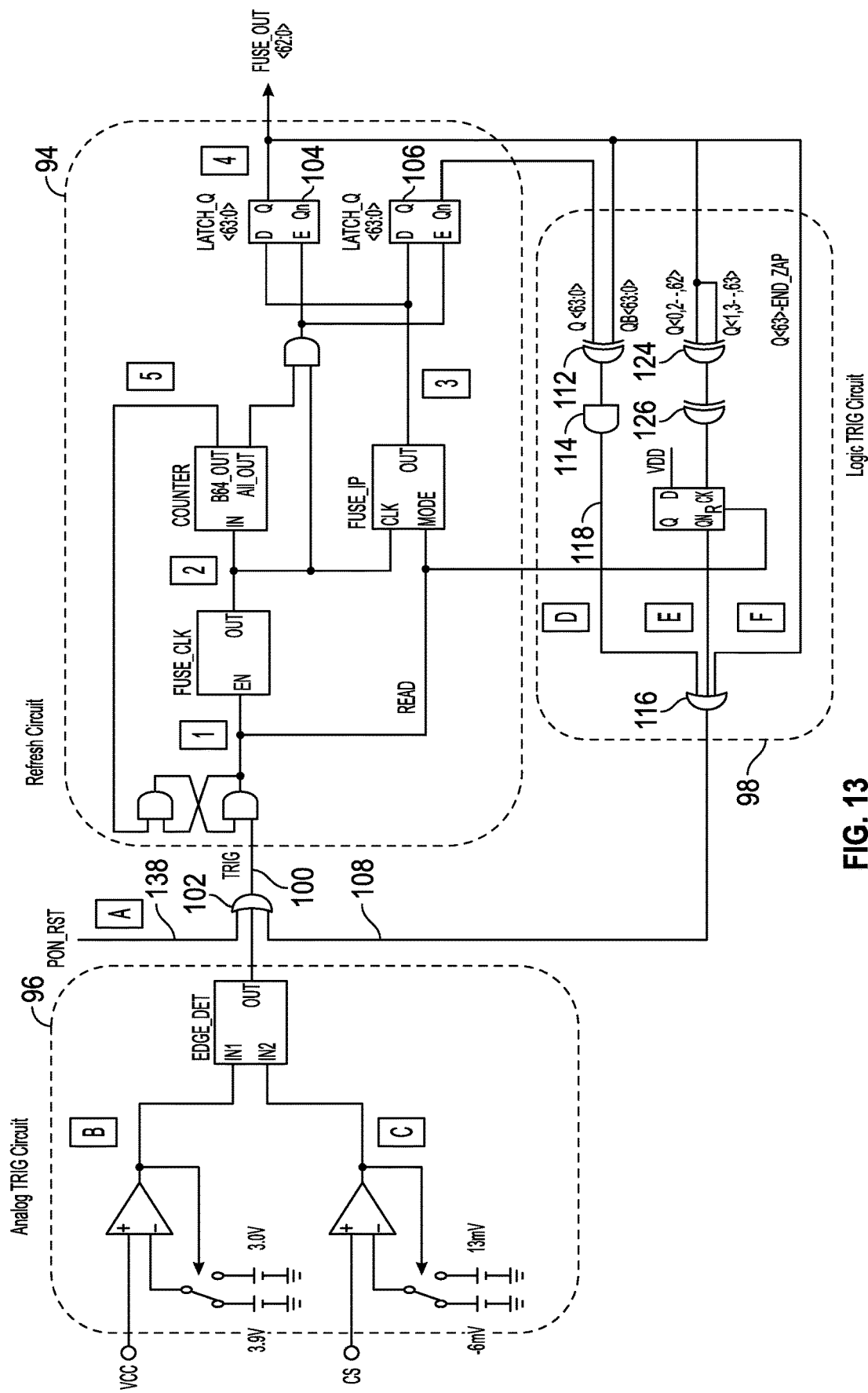
FIG. 13 is circuit diagram of another implementation of a trigger circuit and another implementations of a refresh circuit including a first latch and a first dummy latch.

Referring to FIG. 13, a circuit diagram of a fuse refresh circuit 94 is illustrated coupled to an analog trigger circuit implementation 96, and a logic trigger circuit implementation 98. These circuit implementations are included in a battery protection IC like those disclosed herein which can be coupled with a battery and various FETs. The analog trigger circuit implementation 96 is similar to the implementation illustrated in FIG. 10 and functions as described in reference to that figure and as described herein. As is illustrated, the fuse refresh circuit 94 receives a trigger signal 100 from OR gate 102 which triggers the rereading of the fuse data from the fuse array. However, in this implementation, the fuse data is not read or reread into a single set of latches, but into two sets of latches, a first plurality of latches and a second plurality of latches (dummy latches), represented here by first latch 104 and first dummy latch 106. As will be described hereafter, the term "dummy" refers to the fact that the dummy latch is a redundant latch that does not directly couple with a MOSFET coupled in parallel with a resistor, and therefore does not directly function to generate a threshold voltage. Both sets of latches 104, 106 may be seen in FIG. 14-1. The fact that the second plurality of latches 106 has its own separate independent connection to system power is indicated by the dotted line 110 surrounding the plurality of dummy latches 106.

The existence of the second plurality of latches (dummy latches) 106 allows for the use of digital logic circuits to retrieve, compare, and analyze the stored states of the first plurality of latches during operation to evaluate the effects of noise. Since the dummy latches 106 may be physically located on a different section of the battery protection IC than the first plurality of latches 104, any issues with common impedance caused by the extra latches may be reduced or eliminated. The dummy latches 106 do not influence the first plurality of latches 104 during load or charging, so the probability that the stored states of the dummy latches 106 would change at the same time the stored states of the first plurality of latches 104 would also change becomes very small. In various implementations, the timing of the two latch sets is different (i.e., they have different clocking frequencies), which further reduces the probability of synchronized simultaneous state changes between the two latch sets. As can be observed from FIG. 13, when the first plurality of latches 104 output a logic 1, the second plurality of latches 106 output a logic 0 as the output of these latches is connected to the Qn (inverted) output of the gated D latch. Accordingly the outputs/states of the two sets of latches are inverses of each other.

This aspect of the two sets of latches can be used in various logic circuits disclosed herein that act to verify and check the stored states of the two sets of latches against one another, and refresh the data values stored in both sets of latches if a deviation is detected. Logic trigger circuit 98 contains several sets of logic circuits that perform various latch state comparisons and generate a logic trigger signal that is received by OR gate 102 if a deviation is detected. Also referring to FIG. 14-2 (which shows a 4 bit set of latches), the logic trigger circuit includes a logic circuit 120 that includes plurality of exclusive OR (EXOR, XOR) gates 112, illustrated in summary form in FIG. 13 for a 64 bit set of latches.

Figures 1, 14:
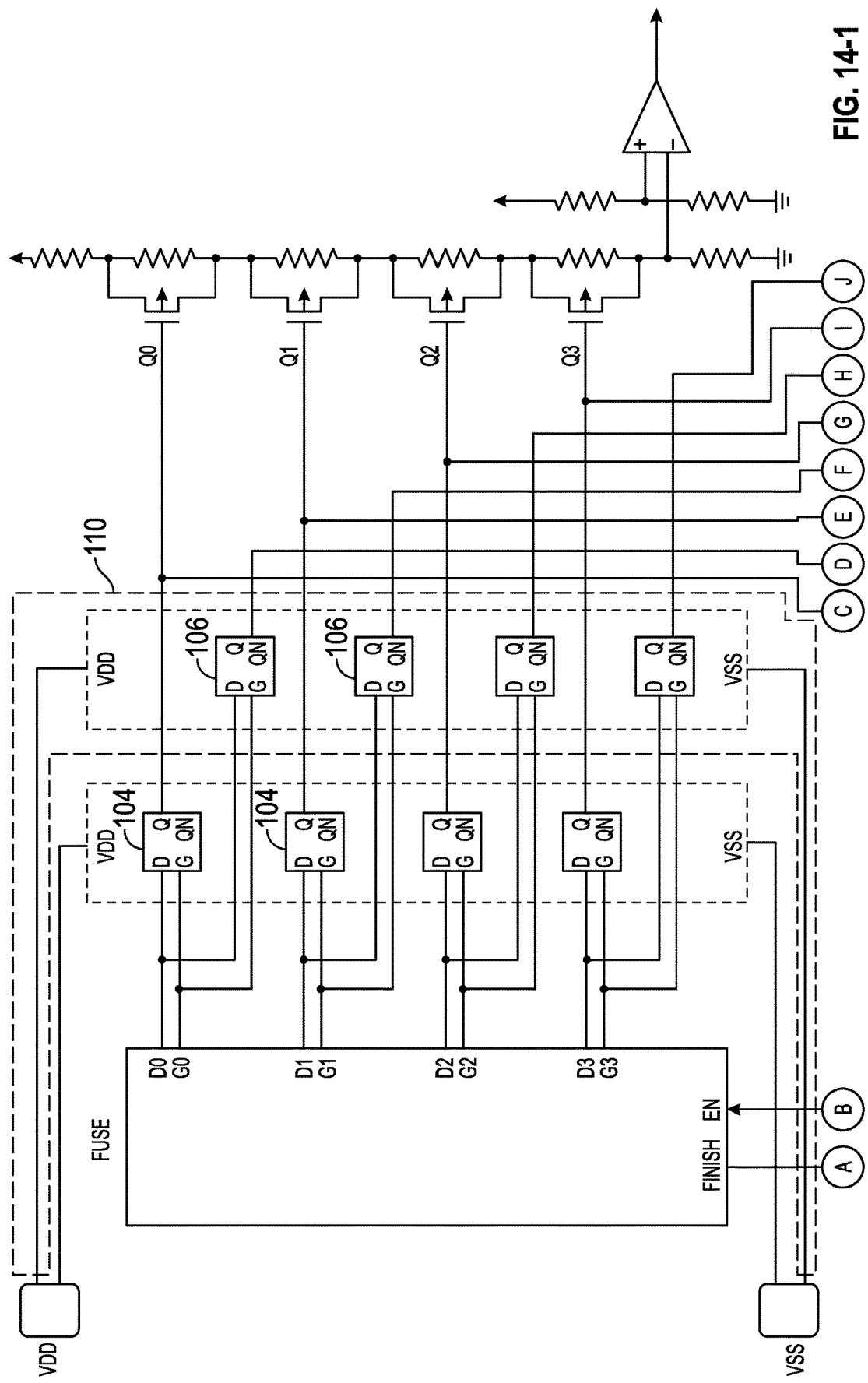
Figures 2, 14:
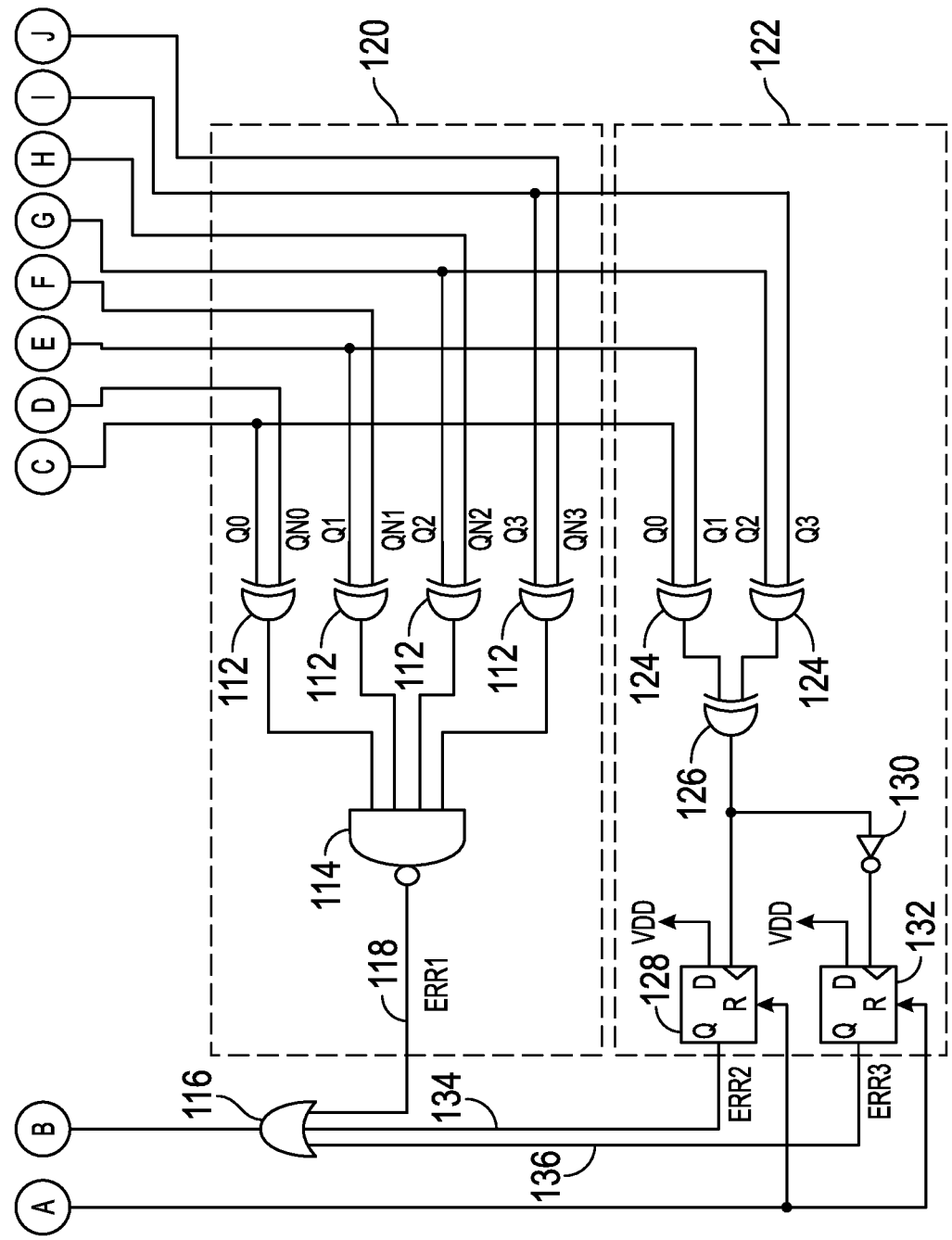

As can be seen from the wiring illustrated in FIG. 13 and the notation on the inputs to each XOR gate of the plurality of XOR gates 112 in FIG. 14-2, each XOR gate performs a comparison of the Q output of the first latch of the plurality of latches with the Qn output of the first dummy latch of the second plurality of latches and outputs to an AND gate 114 (which may be inverted in various implementations as illustrated in FIG. 14-2). The output of the AND gate 114 is provided to OR gate 116 (which may be the same OR gate 102 in various implementations, or a separate OR gate entirely, as illustrated in FIG. 13). The output of the AND gate 114 is a first logic trigger signal 118. For the output of the AND gate 114 to output a first logic trigger signal 118, one or more of the pairwise XOR comparisons of the state of the first latch with the first dummy latch (and so on, through each pair of corresponding latches) must become false (error) resulting in the XOR gate returning a 0 value. Since the truth table of the AND gate 114 requires the sum of the XOR gate values, for example, to all be 1 (or 0) in the case of no deviation, any one of the XOR gates returning a 0 value will cause the AND gate 114 to output a 0. In the case, where the AND gate 114 output is inverted, as in FIG. 14-2, the corresponding first logic trigger signal 118 will become a logic 1. The OR gate 116 then receives the first logic trigger signal 118 and then uses it to generate the trigger signal 100, which causes the fuse refresh circuit 94 to refresh the states of the first plurality of latches 104 and the second plurality of latches 106 using the states of the array of fuses.

As illustrated, a second digital logic circuit 122 is included in the logic trigger circuit 98. This circuit includes a plurality of XOR gates 124 arranged in parallel and another XOR gate 126 coupled in series with the plurality of XOR gates 124. As illustrated in FIGS. 13 and 14-2, the inputs to the plurality of XOR gates are the outputs of each latch and immediately adjacent latch in the first plurality of latches. This pairwise comparison of each set of adjacent latches by each XOR gate in the plurality of XOR gates 124 is fed into XOR gate 126. The effect of combining the plurality of XOR gate outputs into the XOR gate 126 is to determine whether the sum of the states of the first plurality of latches is even or odd. If even, the XOR gate 126 will output 0, if odd, the XOR gate 126 will output a 1 (or vice versa, depending on the nature of the gates). The output of XOR gate 126 is received as a clock signal by a first D flip flop 128 and by an inverter 130 coupled to the clock signal of a second D flip flop 132. The effect of coupling the output of the XOR gate 126 to the clock signals of the first D flip flop 128 and second D flip flop 132 is that if a change in the output of the XOR gate 126 is detected (1 to 0 or 0 to 1), the first D flip flop 128 will send an output out as a second logic trigger signal 134 (if the change is from 0 to 1). If the change in the output of the XOR gate 126 is from 1 to 0, the second D flip flop 132 (via the inverter 130) will be clocked and output a second logic trigger signal 136. The second logic trigger signals 134, 136 are received by OR gate 116 and used to generate a logic trigger signal 108.

Logic trigger signal 108 will also be triggered if a change of state of the fuse in the fuse array that records whether the fuse array has been trimmed or not is changed. In FIG. 13, this change of state is referred to as END_ZAP. This change of state is set after completion of the last test during test mode of the device prior to shipment, and is set to a 1 value. In the implementation illustrated in FIG. 13, the last fuse of the fuse array Q<63> is used to store the END_ZAP state. If the value of the corresponding latch changes from 1 to 0, this will be detected by the logic trigger circuit 98 through the OR gate 116, generating the logic trigger signal 108 and signaling a refreshing of the plurality of latches 104 and 106.

The fact that the sum of the of states of the first plurality of latches has changed from even to odd or odd to even indicates that noise has affected at least one value in the plurality of latches, and, if the first digital logic circuit 120 does not indicate that the pairwise XOR comparison of the states of the first and second plurality of latches have changed, indicates that the noise has affected both values of the first plurality and second plurality of latches at the same time. This kind of simultaneous error could not be detected using the first logic circuit 120, but requires monitoring whether the sum of the states of the plurality of latches has changed from even to odd (at one or more bit values).

The effect of the first logic circuit 120 and second logic circuit 122 in combination with the logic trigger circuit 98 on the states of the various latches can be observed in FIGS. 15A-D and 16A-D. FIGS. 15A and 16A illustrate the initial state of the first plurality of latches (Q) and the second plurality of latches (Qn) on power on. As in various implementations previously described (and illustrated by Power on/Reset signal 138 in FIG. 13), the fuse refresh circuit 94 automatically reads the data from the fuse array following triggering at power on (which is a 4 bit fuse array in this example). The result after Fuse reading is illustrated in FIGS. 15B and 16B. Noise then changes the latch of the first plurality of latches corresponding to bit 2, flipping it from 1 to 0. The effect of the XOR gate comparisons performed on pairs of corresponding first latches and first dummy latches shows that the XOR comparison has shifted from 1 to 0. In response, the logic trigger circuit 98 sends a logic trigger signal 108 to fuse refresh circuit 94, and the fuse states are reread into the first plurality of latches and second plurality of latches, as illustrated in FIG. 15D. The same result and response would take place if it was the value of the first dummy latch that changed, or more than one latch value changed.

FIG. 16C shows the situation where both the value of the first latch and the first dummy latch both change under the effect of noise and both change to opposite values (from 1, 0 to 0, 1). As can be observed, the XOR gate comparisons done by the first logic circuit 120 cannot detect the change. However, the second logic circuit's 122 adding of the states of the first plurality of latches and detecting that the sum switched from odd originally to even after the noise would allow the logic trigger circuit 98 to detect the change and generate the logic trigger signal 108 to the fuse refresh circuit 94. The result of the fuse refresh circuit 94 refreshing the states of both the first plurality of latches and the second plurality of latches can be seen in FIG. 16D, which corrected the errors in both sets of latches.

Use of a second plurality of latches in various system implementations may be referred to as a first countermeasure to preventing and detecting errors in the latched data. The logic of the first logic circuit 120 that does pairwise XOR comparisons of the latched data between the first plurality of latches and the second plurality of latches may be referred to as a second countermeasure. The logic of the second logic circuit 122 that evaluates the sum of the states of the first plurality of latches to determine whether two adjacent latches of the first plurality latches and the second plurality of latches have had their values flipped may be referred to as a third countermeasure. Various implementations may contain various combinations of the first, second, and third countermeasures. For example, implementations may include the first and second countermeasures or the first and third countermeasures. A wide variety of possible implementations may be constructed using the principles disclosed herein.

Figure 18:
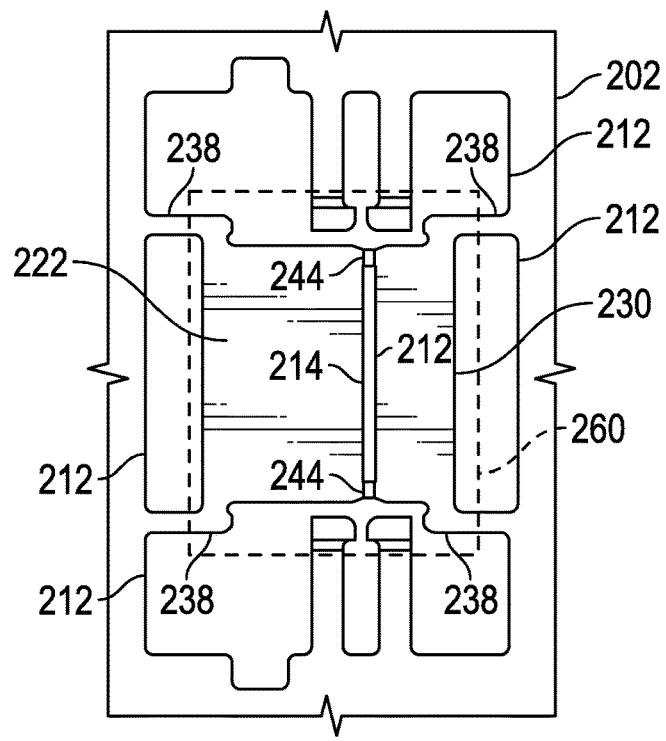
FIG. 18 is a top view of the leadframe of FIG. 17 prior to singulation.

Referring now to FIG. 18, an unsingulated leadframe (leadframe) 202 is shown. The unsingulated leadframe may be made of any leadframe materials, such as copper, aluminum, steel, a metal alloy, any other metal, or any other material, material system, or combination of materials that has high electrical and thermal conductivity. The unsingulated leadframe includes a number of openings 212 which define different portions of the leadframe and which may be formed with etching, cutting, punching, during casting, or using any other material forming techniques. A first island (island) 222 and second island (island) 230 are seen, separated from one another by a slit 214 formed by one of the openings, the islands coupled together with two tie bars 244. Tie bars 238 connect the islands to the rest of the leadframe. Four electrical contacts are seen extending towards the island in the top and bottom of FIG. 18 (two from the top and two from the bottom).

Figure 17:
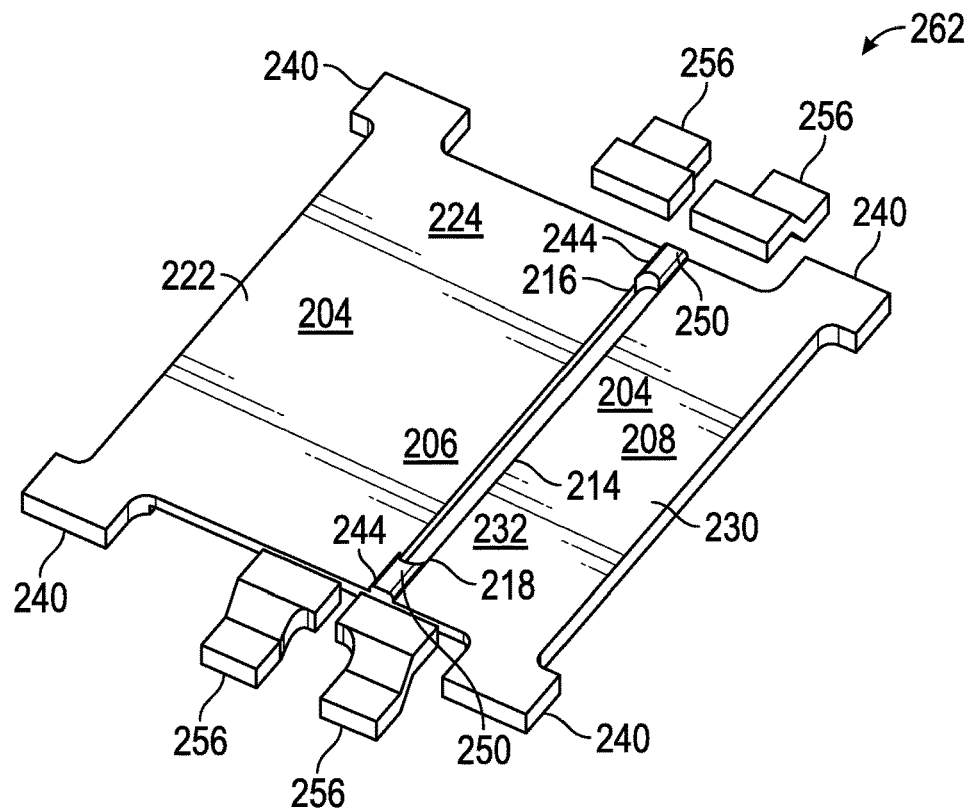
FIG. 17 is a top perspective view of an implementation of a singulated leadframe.

FIG. 18 shows a singulation line 260 along which the unsingulated leadframe 202 is singulated to form the singulated leadframe (leadframe) 262 of FIG. 17. The singulated leadframe 262 includes the first island 222 and the second island 230 separated by slit 214 but coupled together with the two tie bars 244. Electrical contacts (contacts) 240 formed by the singulation of the tie bars 238 are shown, and electrical contacts 256 are also seen. Although various figures show the singulated leadframe, without all of the components of a semiconductor package coupled thereto, in implementations the leadframe is not singulated until a plurality of die are coupled with the leadframe, wirebonds or other electrical connectors are used to electrically couple the die with electrical contacts and/or with each other, and a molding compound or encapsulant has been used to at least partially encapsulate various portions of the leadframe and other elements such as through a resin transfer molding or overmolding or other molding process.

The first island has an upper surface 224 which corresponds with an upper surface 204 of the leadframe 262 and forms a largest planar surface 206 of the leadframe. The second island has an upper surface 232 which also corresponds with the upper surface 204 of the leadframe and forms a second largest planar surface 208 of the leadframe. The upper surfaces 204, 224, and 232 and the largest planar surface 206 and second largest planar surface 208 in the implementation shown in FIG. 17 are all coplanar or substantially coplanar. The upper surface of the first island may have dimensions of, or of about, 1.55 mm by 2.6 mm, and the upper surface of the second island may have dimensions of, or of about, 0.75 mm by 2.6 mm, though in other implementations they could have other dimensions.

FIG. 17 shows that the two islands are separated by a single slit 214 that terminates in a tie bar 244 at a first end 216 of the slit and a tie bar 244 at a second end 218 of the slit. Accordingly, in this implementation there are only two tie bars 244 and only one slit—the two tie bars located at opposing first and second ends of the slit. In other implementations the number and placement of slits and tie bars could be varied. By non-limiting example, if more structural rigidity were needed there could be three tie bars 244 equally spaced from one another by two slits 214, or four tie bars equally spaced from one another by three slits, or a single centrally located tie bar with a slit on either side, or if less structural rigidity is needed only a single tie bar and a single slit (i.e., the tie bar on one end absent), and so forth. Any number of variations of the number and position of the tie bars (equally spaced, unequally spaced, etc.) and the number and position of the slits may be utilized to achieve desired properties of rigidity, decreased or increased heat transfer between islands, less overall material used, and so forth. The tie bars may hold the islands securely in their positions relative to one another during a resin transfer molding process during which a mold compound is used to at least partially encapsulate the leadframe and other elements to form a semiconductor package.

In implementations the slit 214 may be useful to reduce heat transfer between the islands (which may protect a control chip from the heat of a transistor chip). Additionally, the slit may prevent or substantially prevent a solder flow from passing between the two islands, or may together with the tie bars 244 prevent or substantially prevent a solder flow from passing between the two islands. The slit also reduces the amount of material needed to form the leadframe. The slit may also be useful for encapsulation or molding purposes as it allows a portion of a mold compound at the lower surface 210 of the leadframe to be connected to a portion of the mold compound at the upper surface 204 of the leadframe. This may provide a mold lock and help an encapsulated package to stay intact.

In some implementations a long flange could be used instead of a slit. For example, instead of two tie bars 244 separated by a slit, the shape of the tie bars could simply be extended along the full length of the main body of the leadframe where the slit now exists. This would provide a flange that prevents or substantially prevents solder from flowing between the islands. A recess, as will be described hereafter, could still be included at a lower surface of the leadframe, and could extend along the entire underside of the flange. Nevertheless, in some implementations providing a slit instead of a flange may be more likely to prevent or reduce warping of one or more of the islands.

Each of the tie bars 244 shown in FIG. 17 has a protrusion 250 which extends upwards from the upper surface 204 of the leadframe. In other cases only one or only some of the tie bars 244 could have such protrusions, but forming each tie bar with a protrusion helps to further decrease, prevent, or substantially prevent solder flow between the two islands. In some implementations the protrusion extends upwards from the upper surface of the leadframe a thickness of, or a thickness of about, 0.05 mm. In other implementations the protrusion could extend upwards from the upper surface of the leadframe a thickness greater or less than 0.05 mm provided it can prevent solder flow.

In the implementation shown only two islands are present. In other implementations the leadframe could have three islands, four islands, or any other number of islands. Some of the islands could be coupled together only using tie bars that include protrusions, and other islands could be coupled together using only tie bars that do not have protrusions, and other islands could be coupled together using a combination of one or more tie bars with protrusions and one or more tie bars without protrusions, and so forth.

For example, in some implementations it may be desirable to reduce heat transfer between two islands or to provide a slit between the two islands for a mold lock but it may not be necessary to prevent solder flow between them. This may be because the bottom faces of one or more die on one island and the bottom faces of one or more die on the other island are intended to form part of the same electrical node. A slit may be placed between these two islands and they may be coupled together only with one or more tie bars, so as to reduce the amount of heat transfer between the islands or to provide a mold lock, as stated, but the tie bars may lack protrusions since solder flow between these islands may not be detrimental. The same leadframe could also have a third island that holds a die, the bottom surface of which should not form a part of the aforementioned electrical node. This third island may be coupled to one or both of the other islands using only tie bars with protrusions and separated by one or more slits so that solder is not allowed to flow from the other island(s) to the third island, and the slit may also reduce the heat transfer between the third island and the other island(s) and may provide an additional mold lock.

Thus, as mentioned above, in some cases the bottom surface(s) of one or more die placed on one island and the bottom surface(s) of one or more die placed on another island should not be a part of the same electrical node, so that preventing a flow of solder between islands may help to ensure that they do not unintentionally become part of the same electrical node or in other words ensuring that elements do not become electrically shorted. In such cases the islands may be coupled together only using tie bars 244 that have protrusions 250 so that the solder flow is prevented or substantially prevented from flowing between the islands.

Figure 19A:
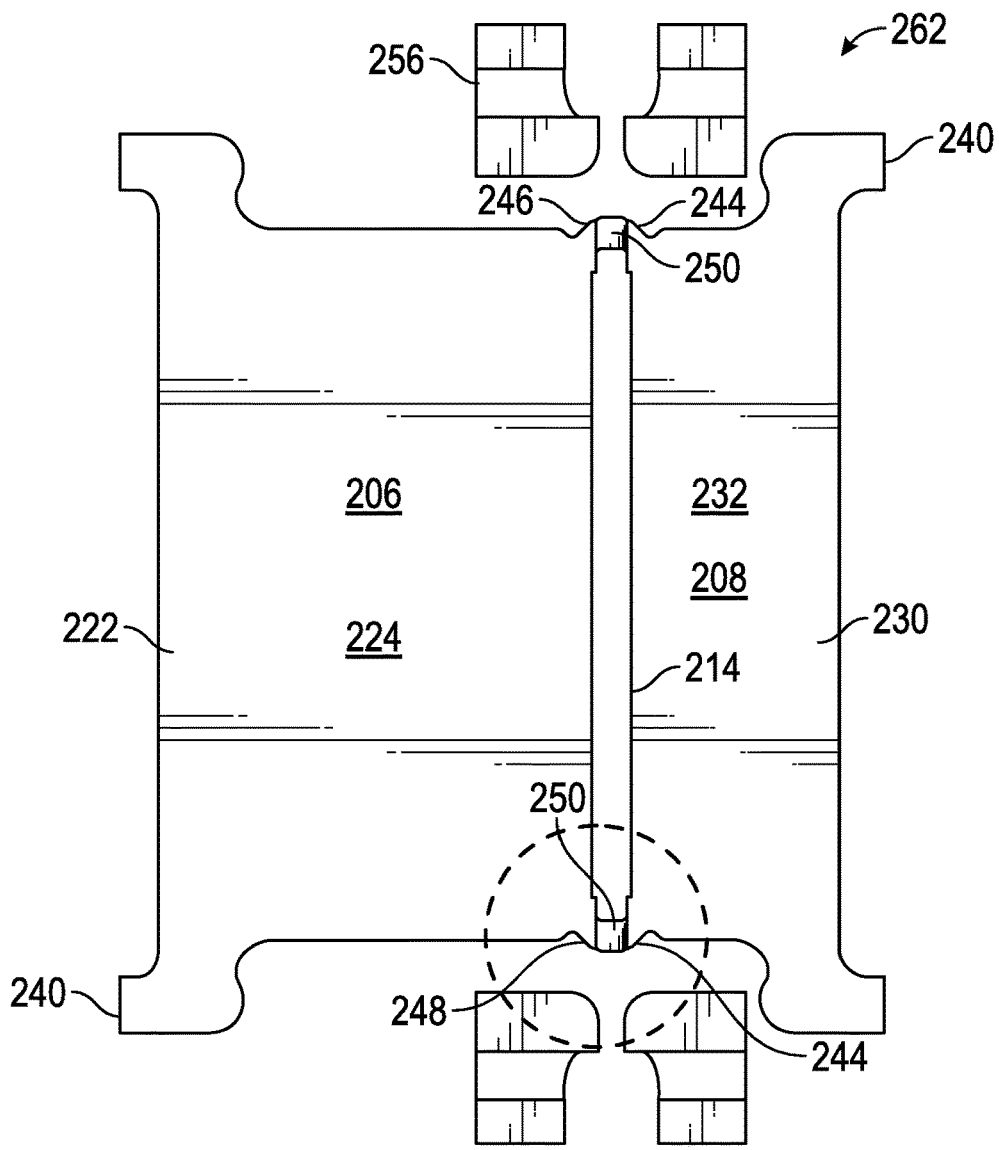
FIG. 19A is a top view of the singulated leadframe of FIG. 17.
Figure 19B:
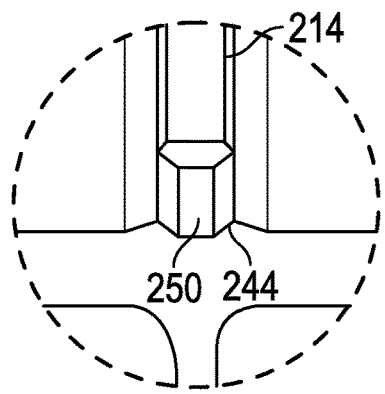
FIG. 19B is a top close-up view of the circled portion of the leadframe of FIG. 19A.

FIG. 19A shows a top view of the leadframe 262. The first island and second island are shown, along with the contacts 240 and 256, the upper surface 224 forming the largest planar surface 206, the upper surface 232 forming the second largest planar surface 208, and two tie bars 244 including a first tie bar 246 at one end of the slit 214 and a second tie bar 248 at an opposing end of the slit. Each tie bar has a protrusion 250 extending upwards from the upper surface of the leadframe, the protrusion extending above the upper surface 224 of the first island and/or the upper surface 232 of the second island. FIG. 19B shows a close-up view of the circled portion of FIG. 19A, in which the protrusion 250 may be seen more clearly. In the implementation shown the protrusion has a shape, or has roughly the shape, of a trapezoidal prism, with the smaller base of the trapezoidal prism facing out of the page and the larger base of the trapezoidal prism facing into the page.

A number of other shapes for the protrusion may be used, and the shape (or a rough shape) of a trapezoidal prism is only one representative example. For example, the protrusion may have a shape of a cube, a cuboid, a right rectangular cuboid, a cone, a conical frustum, a spherical cone, a spherical cap, a spherical segment (or spherical frustum), an arch, and/or any other regular or irregular shape.

Figure 20:
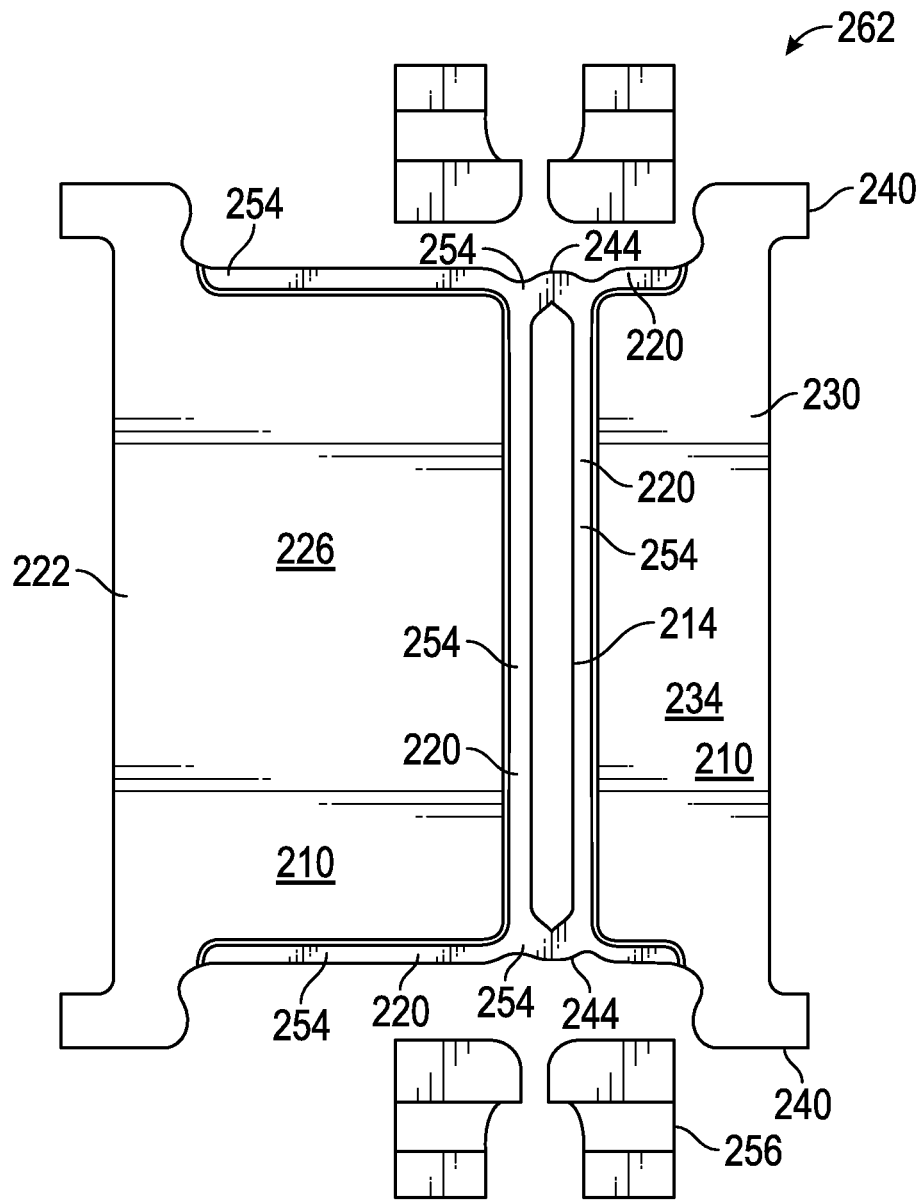
FIG. 20 is a bottom view of the singulated leadframe of FIG. 17.

FIG. 20 shows a bottom view of the leadframe 262. The first island 222 has a lower surface 226 which corresponds with a lower surface 210 of the leadframe. The second island 230 has a lower surface 234 which also corresponds with the lower surface 210 of the leadframe. In the implementation shown the lower surfaces 226, 210, and 234 are all coplanar or substantially coplanar. The electrical contacts 240 and 256 are visible, as are the slit 214 and tie bars 244.

Also seen in FIG. 20 is a recess 254 which runs along the length of the sides of the slit and which also runs along opposite outer sides of the main body of the leadframe, stopping just short of the contacts 240 (seen in the top and bottom of the main body of the leadframe shown in FIG. 20). In the implementation shown in the drawings this recess 254, as can be seen, is present underneath each tie bar 244, so that each tie bar in implementations includes a protrusion on its upper side and a recess on its lower side, or in other words an upper protrusion and a lower recess. The recess 254 in implementations is formed by coining 220, or in other words it may be formed by a metallurgical coining or stamping process. Other metallurgical processes or other materials-forming processes could be used to form the recess. The recess could be formed during a casting process, or material could be removed through grinding, and so forth.

In implementations a recess may exist at opposite ends of the main body of the leadframe, and underneath each tie bar 244, but may not be present along the length of the slit 214. In other implementations the recess could be present only underneath each tie bar 244 and in no other location(s). In still other implementations the recess(s) may be entirely omitted.

The recess(s) may have various shapes. In the implementation shown in FIG. 20 the recess along the length of the slit, and on the opposite ends of the main body of the leadframe, is generally bounded on two sides by generally perpendicular faces of the leadframe formed by the coining, stamping, or other process, so that the recess generally forms a shape along its length (or a cross section, in other words) of a square or rectangle, but the recess may take on other shapes. In some cases there could simply be a linear sloping surface from the slit 214 to the lower surface 226 and a sloping surface from the slit to the lower surface 234, so that a cross section of the recess would be that of a triangle. Indeed, a similar sloping surface of this nature may be seen in FIG. 19B on the upper side of the leadframe, one between the slit and the first island and another between the slit and the second island, and these may also be formed with coining or stamping or any of the other aforementioned processes.

Other cross sections of the recess(s) could be semicircles, or any other regular or irregular shape or portion of a shape. The cross section at the portion of the recess nearest the slit may be the same or similar to the cross section at the portions on opposite ends of the main body of the leadframe, or they could be different. Referring still to FIG. 20, similar recesses could additionally or alternatively be formed on the sides (left and right sides in the figure) of the main body of the leadframe.

Whatever the shape, configuration, and size of the recess(es) 254, in implementations they are useful to form a mold lock or anchor (or frame lock) when a mold compound is later used to encapsulate or partially encapsulate portions of the leadframe and other elements to form a semiconductor package.

In implementations the recess(es) and protrusion(s) could be formed simultaneously, such as through a punching process whereby the lower surface 210 of the leadframe is punched with a punch to indent a portion of it, thus forming the recess(s) 254, while a mold placed at the upper surface 204 includes a cavity into which material of the leadframe is squeezed or forced into during the punching process so that one or more protrusions 250 are formed. In other implementations the protrusion(s) could be formed with a first punching process and the recess(es) could be formed through another punching process. In other implementations one or more of the protrusion(s) and/or recess(es) could be formed during a casting process, and/or any combination of the above or other processes known in the art for metalworking and the like.

FIG. 21 shows the leadframe 262 with a number of die placed thereon. A lower surface of a first die 264 is coupled at the upper surface of the first island 222 using a solder 270. The solder may be any type of conductive, metallic solder, formed with any metals or combination of metals. The solder electrically and physically couples the lower surface of the first die with the leadframe. A lower surface of a second die 272 is coupled at the upper surface of the second island 230 using an electrical insulator 280. The electrical insulator physically couples the lower surface of the second die with the leadframe while electrically insulating the lower surface of the second die from the leadframe. In implementations the electrical insulator may be, by non-limiting example, a non-conductive tape, a non-conductive glue or other adhesive, an epoxy, a non-conductive layer or plate that is not itself adhesive but that is adhered to the second island and then adhered to the second die using an adhesive, and so forth. In the implementation shown in the figures the electrical insulator is a non-conductive die attach film (DAF) having a thickness of, or of about, 0.02 mm, though in other implementations other thicknesses may be used.

FIG. 21 shows the other elements that have been previously described, including the contacts 240 and 256, the slit 214, and two tie bars 244 on opposing ends of the slit each having a protrusion 250 extending upwards from the upper surface of the leadframe above the upper surfaces of the first and second islands. A portion of the recess 254 which exists at an outer edge of the main body 263 of the leadframe is seen towards the lower end of the drawing. Each island in FIG. 21 is shown to have a single die placed thereon, but in implementations more than one die could be placed on each island, so that two, three, four, or more die could be on any particular island. The two contacts 256 in the lowermost portion of the drawing are not actually contacting the main body 263 of the leadframe (nor are they in FIG. 17), but rather are separated a distance from the main body of the leadframe as reflected in FIGS. 19A-B and 20. The main body 263 of the leadframe may have a greatest thickness of 0.15 mm between the upper surface and lower surface of the leadframe, though in other implementations other thicknesses may be used.

Figure 24:
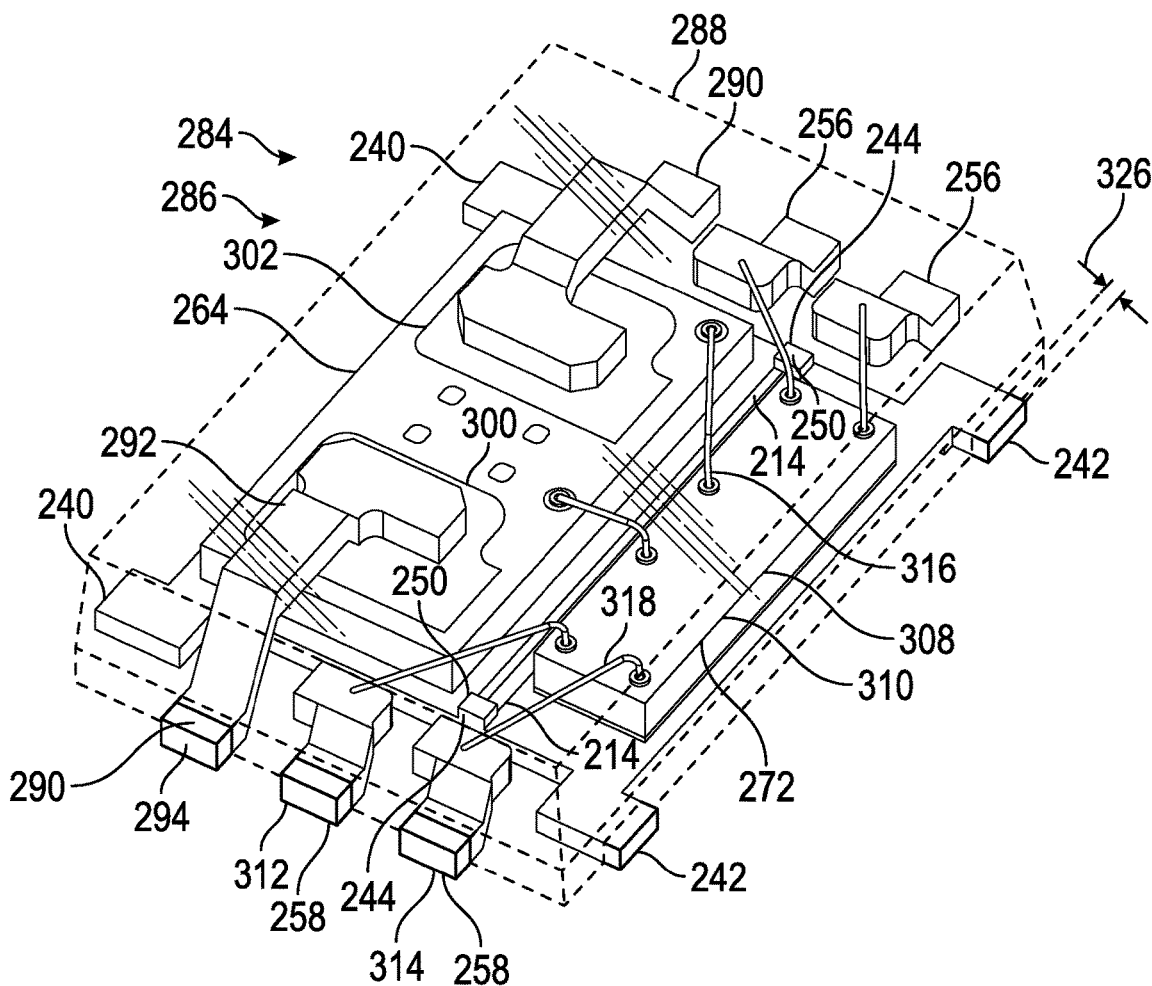
FIG. 24 is a top perspective partial see-through view of the semiconductor package of FIG. 22A.

While it is not as apparent in FIG. 21, FIG. 24 illustrates that the slit 214 may have a longest length that is longer than a longest length of the second die. The slit may also have a longest length that is longer than a longest length of the first die. The first die is always shown larger than the second die in the drawings, but in other implementations of packages the second die could be larger than the first die so that the slit has a longest length that is longer than a longest length of the first die but not longer than a longest length of the second die. In some implementations the longest length of the slit may be longer than a longest length of the first die and may further be longer than a longest length of the second die. In still other implementations the slit may be sized so that its longest length is shorter than a longest length of the first die and a longest length of the second die, though having a larger sized slit may better reduce thermal transfer between the two islands and may provide better mold lock properties.

In the implementation shown in FIG. 21 the first die is seen to have an upper surface 266 and the second die is seen to have an upper surface 274. The upper surface of each die may have exposed electrical contacts thereon, and electrical connectors such as wirebonds, clips, or other elements or the like may be used to electrically couple the contacts of the upper face of each die with one or more of the contacts 256 and/or may be used to electrically couple the contacts of the upper face of one die with the contacts of the upper face of another die. The assembly may then be fully or partially molded over or encapsulated using a mold compound to form a semiconductor package.

Figure 23:
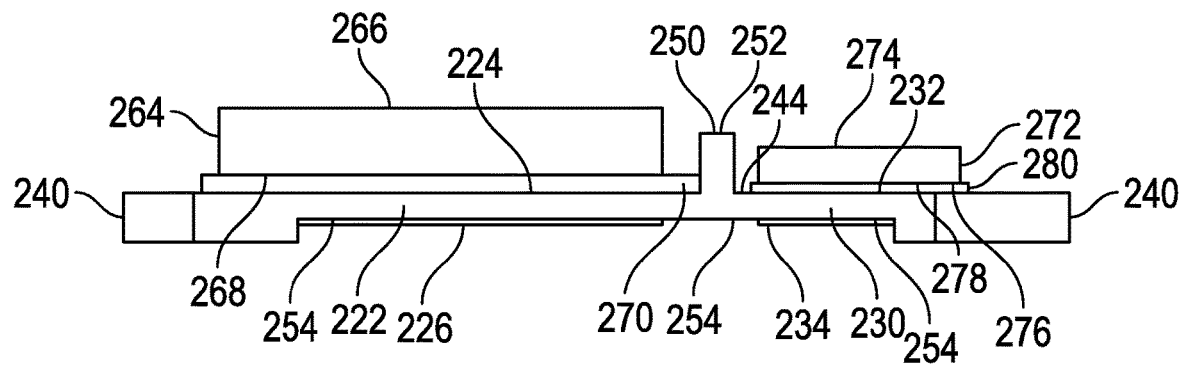
FIG. 23 is a side view of the elements of FIG. 21 with some of the electrical contacts not shown.

FIG. 23 shows a side view of the elements of FIG. 21 with the contacts 256 absent so that other elements may be more clearly seen. The singulated leadframe is shown having the first island 222 and second island 230. The contacts 240 are visible. The lower surface 268 of the first die 264 is seen physically and electrically coupled at the upper surface 224 of the first island with a solder 270. The solder does not flow to the second island because the protrusion 250 of the tie bar 244 forms a solder dam 252. The lower surface 276 (which in the implementation shown is a bottom surface 278) of the second die 272 is physically coupled with, and electrically insulated from, the upper surface 232 of the second island using an electrical insulator 280.

The lower surface 226 of the first island and lower surface 234 of the second island may also be seen. The recess 254 is visible as well. The upper surface 266 of the first die and the upper surface 274 of the second die may be used for coupling electrical contacts of the die with other elements, as discussed previously.

FIG. 24 shows a semiconductor package (package) 284, which in the implementation shown is an ultrathin dual flat no-lead package (UDFN or UTDFN) 286, which is formed using the elements of FIG. 23. Other package configurations could be formed using the methods and elements described herein, including a dual flat no-lead package (DFN), a thin dual flat no-lead package (TDFN), an extremely thin dual flat no-lead package (XDFN), a quad flat no-lead package (QFN), a quad flat no-lead package with top-exposed pad (QFN-TEP), a thin quad flat no-lead package (TQFN), a leadless leadframe package (LLP), a leadless plastic chip carrier (LPCC), a micro-leadframe (MLF), a micro-leadframe package dual (MLPD), a micro-leadframe package micro (MLPM), a micro-leadframe package quad (MLPQ), a dual-row micro-leadframe package (DRMLF), a very thin quad flat no-lead (VQFN or WQFN), an ultrathin quad flat no lead package (UQFN), and various other configurations.

Package 284 is seen in FIG. 24 to include the first die 264 and second die 272. The contacts 240 are shown extending outwards beyond a mold compound 288 to form exposed surfaces 242. The mold compound is shown in see-through so that other elements of the package may be more clearly seen. Exposed surfaces 258 of contacts 256 are also shown. There are also electrical contacts (contacts) 290, which are clips 292 each of which has an exposed surface 294 extending outwards beyond the mold compound 288.

In the implementation shown the exposed surfaces 242, 258, and 294 extend outwards beyond the mold compound 288 a thickness 326, which in some implementations is a thickness of 0.05 mm, though in other implementations other thicknesses may be used. In some implementations the exposed surfaces 242 each extend out 0.05 mm from the mold compound while the exposed surfaces 258, 294 each extend out 0.10 mm from the mold compound. In some implementations the exposed surfaces 242, 258, and/or 294 could be flush with a surface of the mold compound, and thus not extend beyond the mold compound. In either case, whether the exposed surfaces extend beyond the mold compound, or are flush with a surface of the mold compound, they are exposed through the mold compound so that they may contact an electrical element outside of the package. A number of other thicknesses for the exposed surfaces may be used as desired.

Each clip 292 is electrically coupled with an electrical contact or pad on the upper surface of the first die, such as with a solder, a conductive adhesive, or the like. The first die in the implementation shown includes two field-effect transistors (FETs), a charging FET 300 and a discharge FET 302, similar or identical to the charging and discharge FETs described above for battery packs (such as power MOSFETs for controlling the charging and discharging of a battery pack). Each clip accordingly couples an electrical contact of one of the FETs with the exposed surface 294 to couple the FET with an electrical element outside the package. For example, each clip could couple with the source of one of the FETs. The bottom surface of the first die is electrically coupled with the leadframe 262, which may be a ground and/or a thermal pad, and so a drain of each FET may be located on the lower surface of the first die so as to be in electrical communication with the leadframe 262. In the implementations shown in FIG. 24 the transistors are metal-oxide-semiconductor field-effect transistors (MOSFETs), though in other implementations they could be insulated gate bipolar transistors (IGBTs) or another type of transistor, or some other switching element. In the implementation shown the clips are soldered to the upper surface of the first die.

In implementations the clips 292 are included in a second leadframe that is coupled with leadframe 262 after the die have been coupled with the islands. As indicated above, the clips may be soldered or otherwise adhered to the first die. The molding compound may be applied, such as through a resin transfer molding process, an overmolding process, or some other process, and then the second leadframe and leadframe 262 may be singulated at the same time using any singulation technique such as punching, sawing, cutting, etc., to form package 284.

The second die of FIG. 24 includes a control element 308 which controls the switching element of the first die. In the implementation shown the control element includes a control integrated circuit (control IC) 310 which may be a battery protection integrated circuit as has been described in this document with respect to battery packs, though other types of control circuits/devices may be included/substituted as well. The battery pack may be a battery pack for a mobile device, such as a smart phone, a tablet, and so forth. One of the contacts 256 may be a current sense and testing pin 312 and another of the contacts 256 may be a test (testing) pin 314, similar or identical to other current sense and testing pins and test (testing) pins described above.

A number of electrical connectors 316 are shown electrically coupling various elements of the package 284. These are represented as wirebonds 318, though in some implementations they could include clips or some other coupling element. In the implementation shown there are wirebonds electrically coupling the first die with the second die and the first die with contacts 256. The electrical connectors which couple the second die with the first die may be coupled at the gate contacts of the aforementioned FETs and may accordingly control the FETs by controlling the gate input. Any of the wirebonds, contacts, clips, or the like disclosed herein may be formed of any metals such as copper, aluminum, steel, and so forth.

FIG. 24 also shows other elements previously described. Two tie bars 244 are seen, each having a protrusion 250 extending upwards from an upper surface of the leadframe 262 above the upper surfaces of the first island and second island. The slit 214 may also be seen between the two tie bars 244.

FIGS. 22A-22C show non-see-through views of the semiconductor package 284, which in the implementation shown is a UDFN package 286. FIG. 22A is a top view of package 284 and shows a number of exposed surfaces 258 of the electrical contacts 256 extending outwards beyond the mold compound 288. Exposed surfaces 294 of contacts 290 and exposed surfaces 242 of contacts 240 are also shown extending outwards beyond the mold compound. FIG. 22B shows a side view of package 284 and FIG. 22C shows a bottom view. In FIG. 22C it may be seen that an exposed surface 228 including all or a portion of the lower surface 226 of the first island is exposed through the mold compound at the bottom of the package, and that an exposed surface 236 including all or a portion of the lower surface 234 of the second island is also exposed through the mold compound at the bottom of the package.

FIGS. 22A-22C also show that the package has a thickness 320 from a lower surface to an upper surface which in implementations is, or is about, 0.75 mm, though in other implementations other thicknesses could be used. A first length 322 is shown, which in implementations may be, or may be about, 2.625 mm, though in other implementations other thicknesses may be used. A second length 324 is shown which in implementations may be, or may be about, 4.0 mm, though in other implementations other thicknesses may be used. The tie bars 244 are not visible in the bottom view of FIG. 22C because the recess 254 allows the mold compound to cover the underside of each tie bar even when the mold compound is flush with the lower surfaces 226 and 234 of the first and second islands, as shown. In implementations the first die has dimensions of, or of about, 2.4 mm by 1.35 mm by 0.2 mm, though in other implementations other dimensions may be used. In implementations the second die has dimensions of, or of about, 2.0 mm by 0.6 mm by 0.2 mm, though in other implementations other dimensions may be used.

FIGS. 22A-22C and FIG. 24 show implementations of semiconductor packages in which each die is completely encapsulated and in which each island is also completely encapsulated except for a lower surface of each island, which is exposed through the mold compound. Nevertheless, with the package shown in these figures a majority of each island is encapsulated in the mold compound because the upper surface of each island is encapsulated in the compound and the sides (i.e., the sides of the main body of the leadframe between the contacts 240 and the sides of the slit between the two islands) are encapsulated in the mold compound. In other implementations more or less of each island could be encapsulated in the mold compound, so that less than a majority of each island is encapsulated in the mold compound, or so that substantially all of each island is encapsulated in the mold compound, and so forth.

The exposed surfaces 228 and 236 of the first and second islands, respectively, may be ground pads that are connected to electrical ground, and may correspond with the drain contacts of one or more FETs, as previously described. They may also be used for heat transfer to draw heat away from the die, and the relatively large surface area of the exposed surfaces may facilitate desirable thermal transfer properties for this purpose.

Having the islands of a leadframe directly coupled together with one or more tie bars may provide increased rigidity and stability of the leadframe during processing so that the islands do not move or shift in undesirable ways. Having protrusions on the tie bars 244 may remove the failure mode or otherwise undesirable behavior of a package that occurs when solder used to mount the transistor chip on the leadframe flows to the control chip (which may cause failure or undesirable behavior notwithstanding the control chip being mounted on the leadframe using an electrical insulator due to the fact that it may provide an electrical short between the control IC and the leadframe).

In places where the description above refers to particular implementations of semiconductor leadframes and packages with solder dams and related methods and implementing components, sub-components, methods and sub-methods, it should be readily apparent that a number of modifications may be made without departing from the spirit thereof and that these implementations, implementing components, sub-components, methods and sub-methods may be applied to other semiconductor leadframes and packages with solder dams and related methods.

What is claimed is:

1. A leadframe for a semiconductor package, comprising:
    a first island comprising a first surface, wherein the first surface of the first island is configured to couple to a die;
    a second island; and
    one or more tie bars comprising a protrusion extending outward from the first surface of the leadframe above a surface of the first island wherein the first island and the second island are coupled together only through the one or more tie bars;
    wherein a second surface of the first island opposing the first surface is configured to couple with a mounting board.

2. The leadframe of claim 1, wherein the one or more tie bars comprises two tie bars.

3. The leadframe of claim 1, wherein at least one of the one or more tie bars comprises a recess at a lower surface of the leadframe.

4. The leadframe of claim 1, wherein the leadframe comprises a slit between the island and the second island.

5. The leadframe of claim 1, wherein one or more electrical contacts extend from the island and one or more electrical contacts extend from the second island.

6. A semiconductor package, comprising:
    a leadframe comprising:
        a bonding region comprising at least one die, the bonding region comprising a slit that divides the bonding region; and
        a protrusion of at least one of one or more tie bars located adjacent to the slit in the bonding region; and
    a mold compound encapsulating the bonding region and the at least one die, and
    a plurality of electrical contacts each comprising an exposed surface exposed through the mold compound.

7. The semiconductor package of claim 6, wherein at least one electrical connector electrically couples the at least one die with at least one of the electrical contacts.

8. The semiconductor package of claim 6, wherein the one or more tie bars comprises a recess at a lower surface of the leadframe.

9. The semiconductor package of claim 6, wherein the leadframe further comprises only two tie bars, the two tie bars located on opposing ends of the slit.

10. The semiconductor package of claim 6, further comprising an upper surface of a first island, the upper surface comprising a largest planar surface of the leadframe.

11. The semiconductor package of claim 10, further comprising an upper surface of a second island, the upper surface comprising a second largest planar surface of the leadframe.

12. The semiconductor package of claim 6, wherein the mold compound encapsulates a majority of the bonding region.

13. A semiconductor package, comprising:
    a leadframe comprising:
        a bonding region comprising at least one die, the at least one die coupled with the leadframe and comprising one of a field effect transistor (FET), an insulated gate bipolar transistor (IGBT), or a control integrated circuit configured to control the transistor; and
        a first tie bar at a first end of a slit in the bonding region and a second tie bar at a second end of the slit, one of the first tie bar, the second tie bar, or both the first tie bar and the second tie bar comprising a protrusion extending from the surface of the bonding region; and
    a mold compound encapsulating the at least one die and the bonding region, and;
    a plurality of electrical contacts each comprising an exposed surface exposed through the mold compound.

14. The semiconductor package of claim 13, wherein at least one electrical connector electrically couples the at least one die with at least one of the electrical contacts.

15. The semiconductor package of claim 13, wherein the protrusion is configured to substantially prevent a flow of a solder when the at least one die is bonded to the bonding region.

16. The semiconductor package of claim 13, wherein at least one of the first tie bar or the second tie bar comprises a recess at a lower surface of the first tie bar or the second tie bar.

* * * * *